(12) United States Patent
Kim et al.

(10) Patent No.: US 10,700,309 B2
(45) Date of Patent: Jun. 30, 2020

(54) OPTICAL MEMBER FOR ENHANCING LUMINANCE AND ORGANIC LIGHT-EMITTING DISPLAY DEVICE HAVING THE SAME

(71) Applicant: LG DISPLAY CO., LTD., Seoul (KR)

(72) Inventors: Youngwook Kim, Seoul (KR); Hyunjong Noh, Gyeonggi-do (KR); Seonghan Hwang, Gyeonggi-do (KR); Chimyung Ahn, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/383,302

(22) Filed: Dec. 19, 2016

(65) Prior Publication Data
US 2018/0006274 A1    Jan. 4, 2018

(30) Foreign Application Priority Data

Jun. 30, 2016 (KR) .................. 10-2016-0082825

(51) Int. Cl.
*H01L 51/52* (2006.01)
*G02B 27/28* (2006.01)
(Continued)

(52) U.S. Cl.
CPC ........ *H01L 51/5281* (2013.01); *G02B 5/3016* (2013.01); *G02B 27/286* (2013.01);
(Continued)

(58) Field of Classification Search
None
See application file for complete search history.

(56) References Cited

U.S. PATENT DOCUMENTS 7,012,365 B2    3/2006 Adachi et al.
7,012,367 B2    3/2006 Seki
(Continued)

FOREIGN PATENT DOCUMENTS

CN    1368656 A    9/2002
CN    1591101 A    3/2005
(Continued)

OTHER PUBLICATIONS

Combined Search and Examination Report dated May 25, 2017, issued by the U.K. Patent Office in prosecuting the corresponding U.K. Patent Application No. 1622426.3.
(Continued)

*Primary Examiner* — Shaun M Campbell
(74) *Attorney, Agent, or Firm* — Morgan, Lewis & Bockius LLP

(57) ABSTRACT

Provided are an optical member for enhancing luminance and an organic light-emitting display device having the same. An optical member includes: a linear polarizer, a blue cholesteric liquid crystal (CLC) layer configured to transmit light, the light having only one of: a left-handed circularly polarized light component and a right-handed circularly polarized light component, and a quarter wave plate configured to convert the transmitted light, having the left-handed circularly polarized light component or right-handed circularly polarized light component, into linear polarized light, wherein the blue cholesteric liquid crystal (CLC) layer and the quarter wave plate are located on a same side of the linear polarizer.

18 Claims, 17 Drawing Sheets

(51) Int. Cl.
  *G02B 5/30* (2006.01)
  *H01L 27/32* (2006.01)
  *G02B 1/11* (2015.01)
(52) U.S. Cl.
  CPC ........ *H01L 27/322* (2013.01); *H01L 27/3246* (2013.01); *G02B 1/11* (2013.01); *H01L 27/3213* (2013.01); *H01L 51/5265* (2013.01); *H01L 51/5284* (2013.01)

(56) References Cited

U.S. PATENT DOCUMENTS

| | | | |
|---|---|---|---|
| 7,732,809 B2 | 6/2010 | Adachi et al. | |
| 8,125,143 B2 | 2/2012 | Park et al. | |
| 9,599,827 B2 | 3/2017 | Li et al. | |
| 2002/0167630 A1 | 11/2002 | Fujieda et al. | |
| 2003/0020855 A1* | 1/2003 | Lee | G02B 5/201 349/115 |
| 2003/0146695 A1* | 8/2003 | Seki | H01L 27/3246 313/506 |
| 2004/0051445 A1* | 3/2004 | Adachi | G02B 5/3016 313/504 |
| 2004/0189167 A1 | 9/2004 | Adachi et al. | |
| 2005/0035353 A1 | 2/2005 | Adachi et al. | |
| 2005/0041183 A1* | 2/2005 | Lee | G02F 1/133512 349/106 |
| 2008/0094546 A1* | 4/2008 | Kim | G02F 1/133528 349/96 |
| 2009/0096937 A1* | 4/2009 | Bauer | B60R 1/12 348/739 |
| 2010/0072880 A1* | 3/2010 | Adachi | H01L 27/12 313/498 |
| 2010/0182552 A1 | 7/2010 | Park et al. | |
| 2011/0234572 A1 | 9/2011 | Toko | |
| 2012/0056211 A1 | 3/2012 | Kitagawa et al. | |
| 2013/0222749 A1* | 8/2013 | Chiang | G02F 1/133512 349/113 |
| 2013/0258250 A1* | 10/2013 | Jung | G02F 1/133528 349/65 |
| 2014/0063384 A1 | 3/2014 | Li et al. | |
| 2015/0262536 A1* | 9/2015 | Chen | G09G 3/36 345/92 |
| 2015/0362648 A1* | 12/2015 | Park | G02F 1/133528 349/96 |
| 2016/0103351 A1 | 4/2016 | Lavrentovich et al. | |
| 2016/0315129 A1* | 10/2016 | Hack | H01L 27/3244 |
| 2017/0061846 A1* | 3/2017 | Yao | G09G 3/2003 |

FOREIGN PATENT DOCUMENTS

| | | |
|---|---|---|
| CN | 1225149 C | 10/2005 |
| CN | 102809829 A | 12/2012 |
| CN | 101783360 A | 3/2015 |
| CN | 102830540 B | 7/2015 |
| JP | 2004-030955 A | 1/2004 |
| JP | 2006-195317 A | 7/2006 |
| JP | 2009-283246 A | 12/2009 |
| JP | 2011-060604 A | 3/2011 |
| JP | 2012-133312 A | 7/2012 |
| TW | I521280 B | 2/2016 |
| WO | 2009026223 A2 | 2/2009 |
| WO | 2011/030879 A1 | 3/2011 |
| WO | 2014/194173 A | 12/2014 |

OTHER PUBLICATIONS

Taiwanese Office Action dated Feb. 21, 2017, for Taiwan Patent Application No. 105132623.
Japanese Office Action dated Jan. 30, 2018, in corresponding Japanese Patent Application No. 2017-009959.
Office Action from the China National Intellectual Property Administration dated Feb. 3, 2020 in a corresponding Chinese patent application No. 201611242076.0.

\* cited by examiner

FIG. 10

| LUMINANCE CHARACTERISTICS | COMPARATIVE EXAMPLE 1 | | | | EXPERIMENTAL EXAMPLE 1-1 | | | | EXPERIMENTAL EXAMPLE 1-2 | | | | EXPERIMENTAL EXAMPLE 1-3 | | | | EXPERIMENTAL EXAMPLE 1-4 | | | |
|---|---|---|---|---|---|---|---|---|---|---|---|---|---|---|---|---|---|---|---|---|
| | W | R | G | B | W | R | G | B | W | R | G | B | W | R | G | B | W | R | G | B |
| $L_v$ | 103.9 | 20.6 | 72.4 | 10.4 | 105.2 | 20.3 | 71.8 | 10.2 | 103.8 | 19.7 | 70.8 | 9.8 | 104.7 | 20.0 | 72.4 | 9.7 | 106.1 | 21.8 | 72.7 | 10.3 |
| CURRENT | 5.08 | 5.99 | 3.85 | 5.98 | 5.10 | 5.92 | 3.86 | 5.90 | 4.55 | 5.78 | 3.83 | 5.48 | 3.78 | 5.84 | 3.86 | 4.86 | 4.11 | 6.30 | 3.86 | 5.01 |
| EFFICIENCY (cd/A) | 20.45 | 3.44 | 18.80 | 1.73 | 20.63 (101%) | 3.42 (99%) | 18.61 (99%) | 1.74 (100%) | 22.81 (112%) | 3.40 (99%) | 22.81 (112%) | 1.78 (103%) | 27.70 (135%) | 3.43 (100%) | 18.75 (100%) | 1.99 (115%) | 25.82 (126%) | 3.47 (101%) | 18.83 (100%) | 2.05 (118%) |

| REFLECTION CHARACTERISTICS | EXPERIMENTAL EXAMPLE 1-1 | EXPERIMENTAL EXAMPLE 1-2 | EXPERIMENTAL EXAMPLE 1-3 | EXPERIMENTAL EXAMPLE 1-4 | COMPARATIVE EXAMPLE 1 |
|---|---|---|---|---|---|
| REFLECTANCE(%) | 0.80% | 0.80% | 0.88% | 0.91% | 0.76% |

FIG. 13

| LUMINANCE CHARACTERISTICS | COMPARATIVE EXAMPLE 2 | | | | EXPERIMENTAL EXAMPLE 2-1 | | | | EXPERIMENTAL EXAMPLE 2-2 | | | | EXPERIMENTAL EXAMPLE 2-3 | | | |
|---|---|---|---|---|---|---|---|---|---|---|---|---|---|---|---|---|
| | W | R | G | B | W | R | G | B | W | R | G | B | W | R | G | B |
| Lv | 102.3 | 20.64 | 71.21 | 10.33 | 104.8 | 21.06 | 72.21 | 9.968 | 104.3 | 21.27 | 73.11 | 9.953 | 105.9 | 20.5 | 73.15 | 9.836 |
| CURRENT | 5.10 | 5.87 | 3.72 | 5.79 | 3.92 | 6.02 | 3.77 | 5.00 | 3.55 | 5.78 | 3.60 | 4.53 | 3.48 | 5.13 | 3.21 | 4.30 |
| EFFICIENCY (cd/A) | 20.06 | 3.52 | 19.14 | 1.78 | 26.73 (131%) | 3.50 (101%) | 19.15 (100%) | 1.99 (114%) | 29.38 (144%) | 3.68 (106%) | 20.31 (107%) | 2.20 (125%) | 30.43 (149%) | 4.00 (115%) | 22.03 (116%) | 2.29 (131%) |

FIG. 14

| REFLECTION CHARACTERISTICS | COMPARATIVE EXAMPLE 2 | EXPERIMENTAL EXAMPLE 2-1 | EXPERIMENTAL EXAMPLE 2-2 | EXPERIMENTAL EXAMPLE 2-3 |
|---|---|---|---|---|
| REFLECTANCE(%) | 0.76% | 0.88% | 0.97% | 1.87% |

FIG. 15

| DIVISION | COMPARATIVE EXAMPLE 2 | | | | COMPARATIVE EXAMPLE 3 | | | | EXPERIMENTAL EXAMPLE 2 | | | |
|---|---|---|---|---|---|---|---|---|---|---|---|---|
| | W | R | G | B | W | R | G | B | W | R | G | B |
| RE4LATIVE LUMINANCE EFFICIENCY | 100 | 100 | 100 | 100 | 117 | 146 | 126 | 117 | 131 | 101 | 100 | 114 |
| WHITE SUB-PIXEL COLOR TEMPERATURE | 7800 | | | | 5400 | | | | 8200 | | | |

OPTICAL MEMBER FOR ENHANCING LUMINANCE AND ORGANIC LIGHT-EMITTING DISPLAY DEVICE HAVING THE SAME

CROSS-REFERENCE TO RELATED APPLICATION(S)

This application claims the benefit of Korean Patent Application No. 10-2016-0082825, filed on Jun. 30, 2016, the entire disclosure of which is hereby incorporated by reference herein.

BACKGROUND

1. Technical Field

The present disclosure relates to a display device, and more particularly, to an optical member for enhancing luminance and an organic light-emitting display device having the same.

2. Discussion of the Related Art

Recently, as interest in information displays has been on the rise, and demand for using portable information media has grown, research into and commercialization of lighter, thinner flat panel displays (FPDs), replacing the existing cathode ray tube (CRT) displays, have been actively conducted.

In the flat panel display field, liquid crystal displays (LCDs) have come to prominence. However, because LCDs are light-receiving devices, rather than light-emitting devices, and have shortcomings in terms of inferior brightness, contrast ratio, viewing angle, and the like, novel display devices that may be able to overcome such shortcomings have been actively developed.

An organic light-emitting display device, one of these novel display devices, is self-luminous, and thus, is excellent in terms of viewing angle and contrast ratio. Also, because the organic light-emitting display device does not require a backlight, the organic light-emitting display device may be lighter and thinner than LCDs, and is advantageous in terms of power consumption. In addition, the organic light-emitting display device may be driven with a low DC voltage and may have a fast response speed.

A basic structure and operational characteristics of an organic light-emitting display device are described in detail with reference to FIGS. 1-2. FIG. 1 is a diagram illustrating the light-emitting principle of a typical organic light-emitting diode. FIG. 2 is a view illustrating the structure of a typical organic light-emitting display device.

With reference to FIG. 1, in general, an organic light-emitting display device includes an organic light-emitting diode (OLED). The OLED includes an anode 18 as a pixel electrode, a cathode 28 as a common electrode, and organic layers 30a, 30b, 30c, 30d, and 30e formed between the anode 18 and the cathode 28.

The organic layer 30a is a hole injection layer (HIL), the organic layer 30b is a hole transport layer (HTL), the organic layer 30d is an electron transport layer (ETL), the organic layer 30c is an emission layer (EML) interposed between the HTL 30b and the ETL 30d, and the organic layer 30e is an electron injection layer (EIL). For enhancing luminous efficiency, the HIL 30a is interposed between the anode 18 and the hole transport layer 30b, and the EIL 30e is interposed between the cathode 28 and the ETL 30d.

In the OLED configured in such a manner, when a positive (+) voltage and a negative (−) voltage are respectively applied to the anode 18 and the cathode 28, holes pass through the HTL 30b and electrons pass through the ETL 30d and are transferred to the EML 30c to form excitons. When the excitons transition from an excited state to a ground state, e.g., a stable state, light is generated.

In the organic light-emitting display device, subpixels each including the aforementioned OLED structure are arranged in a matrix form and selectively controlled with a data voltage and a scan voltage to display an image. The organic light-emitting display device is divided into a passive matrix organic light-emitting display device and an active matrix type organic light-emitting display device using a thin-film transistor (TFT) as a switching device. In the active matrix organic light-emitting display device, a TFT an active device, is selectively turned on to select a subpixel, and light emission of the subpixel is maintained with a voltage maintained in a storage capacitor. In such a general organic light-emitting display device, a circular polarizer is applied to an upper surface of a panel assembly to reduce reflection caused by various types of wires or electrodes formed of a metallic material.

With reference to FIG. 2, a circular polarizer including a quarter wave plate 61 and a linear polarizer 62 is applied to an upper surface of a panel assembly 2 for reducing reflection. In addition, a passivation layer 63 is provided.

In this organic light-emitting display device, the visibility is reduced when it is outdoors (in bright light), and lines and electrode patterns are seen due to an increase of reflectance caused by organic light-emitting diodes, various lines, patterns or the like. Accordingly, the circular polarizer is provided for solving these problems.

The quarter wave plate 61 and the linear polarizer 62 are disposed at an upper portion of a panel assembly 2, and an angle between an optical axis of the quarter wave plate 61 and a transmission axis of the linear polarizer 62 is 45° (degrees). Then, the external light (e.g., ambient light) is reflected within the panel assembly 2, and the reflected external light is orthogonal to the transmission axis of the linear polarizer 62 when exiting from the panel assembly 2, thereby reducing reflectance.

However, in the case of the FIG. 2 related art device, the luminance of the organic light-emitting display device is reduced by at least 50%. In other words, the transmittance of the linear polarizer 62 may be about 40-50%, and the luminance of light generated from the organic light-emitting diode is reduced by more than 50% while light passes through the linear polarizer 62.

The luminance can be enhanced if the transmittance of the linear polarizer 62 is increased, but there is a trade-off relationship in which the reflectance is increased again. Furthermore, when the transmittance of the linear polarizer 62 is increased, unreliability and smudge may be increased.

SUMMARY

Accordingly, the present disclosure is directed to an optical member for enhancing luminance and an organic light-emitting display device having the same that substantially obviate one or more of the problems due to limitations and disadvantages of the related art.

An object of the present disclosure is to provide an optical member for luminance enhancement, and to provide an optical member capable of implementing low reflectance and high luminance at the same time. In addition, another object of the present disclosure is to provide an organic light-emitting display device having the optical member. Another object of the present disclosure is to provide an optical member for enhancing luminance and reducing the reflectance of a panel assembly to decrease the overall reflectance by less than 1%, and to provide an organic light-emitting display device having the same.

Additional features and advantages will be set forth in the description which follows, and in part will be apparent from the description, or may be learned by practice of the invention. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, there is provided an optical member for luminance enhancement and reducing reflection, the optical member including: a linear polarizer, a blue cholesteric liquid crystal (CLC) layer configured to transmit light, the light having only one of: a left-handed circularly polarized light component and a right-handed circularly polarized light component, and a quarter wave plate configured to convert the transmitted light, having the left-handed circularly polarized light component or right-handed circularly polarized light component, into linear polarized light, wherein the blue cholesteric liquid crystal (CLC) layer and the quarter wave plate are located on a same side of the linear polarizer.

In another aspect, there is provided an organic light-emitting display device, including: an optical member for luminance enhancement and reducing reflection, the optical member including: a linear polarizer, a blue cholesteric liquid crystal (CLC) layer configured to transmit light, the light having only one of: a left-handed circularly polarized light component and a right-handed circularly polarized light component, and a quarter wave plate configured to convert the transmitted light, having the left-handed circularly polarized light component or right-handed circularly polarized light component, into linear polarized light, wherein the blue cholesteric liquid crystal (CLC) layer and the quarter wave plate are located on a same side of the linear polarizer, and wherein the optical member is on an upper surface or a lower surface of a substrate including a plurality of organic light-emitting diodes and TFT arrays.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the disclosure.

FIG. 10 is a comparison table illustrating the luminance characteristics of organic light-emitting display devices according to comparative and experimental examples.

FIG. 13 is a comparison table illustrating the luminance characteristics of linear polarizer according to comparative and experimental examples.

FIG. 14 is a comparison table illustrating the reflection characteristics of the organic light-emitting display devices in FIG. 13.

FIG. 15 is a comparison table illustrating the efficiency and color temperature characteristics of a white cholesteric liquid crystal (CLC) and a blue cholesteric liquid crystal (CLC) according to comparative and experimental examples.

Figure 1:
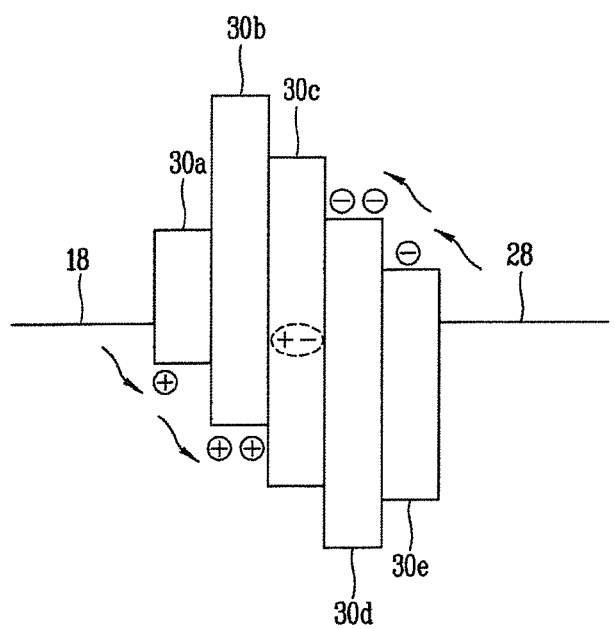
FIG. 1 is a diagram illustrating the light-emitting principle of a typical organic light-emitting diode.
Figure 2:
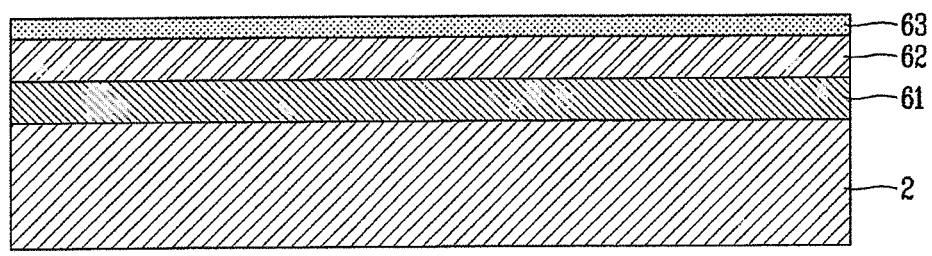
FIG. 2 is a view illustrating the structure of a typical organic light-emitting display device.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Figure 3:
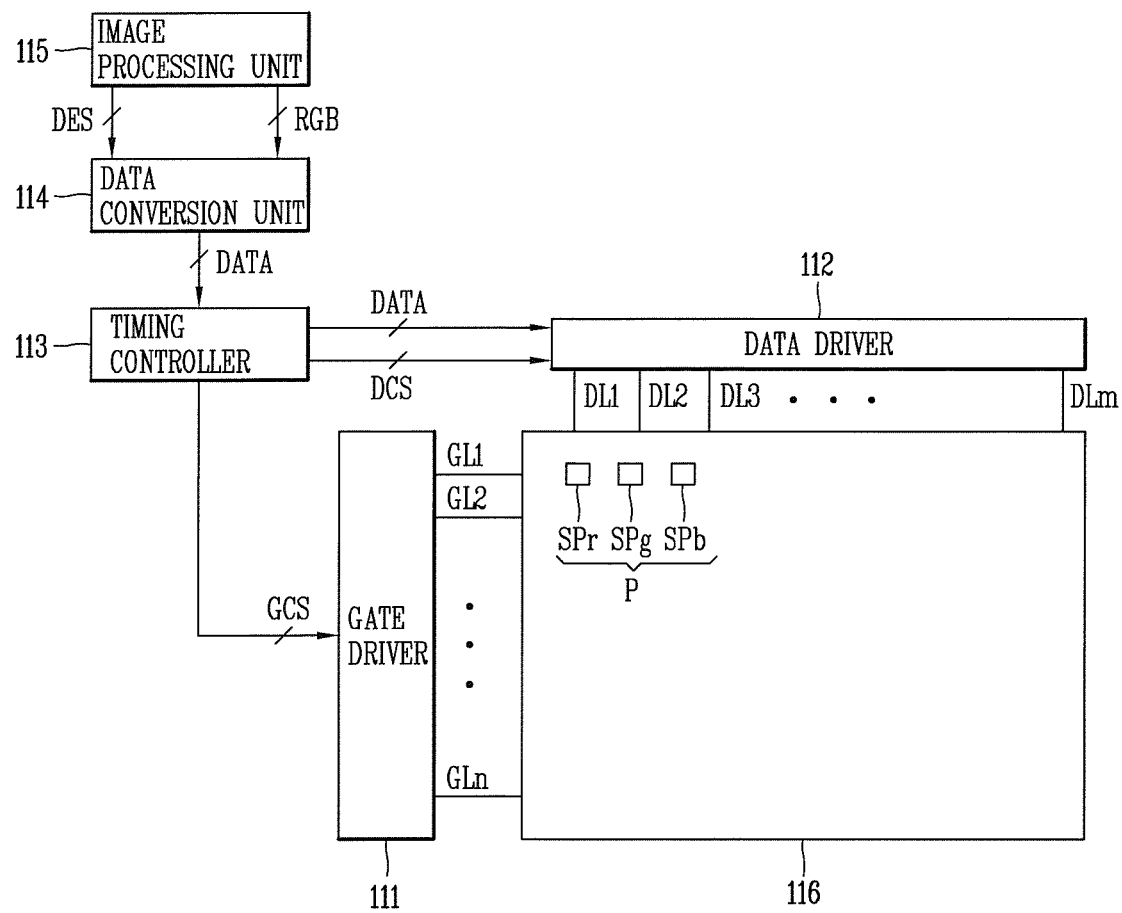
FIG. 3 is a block diagram schematically illustrating an organic light-emitting display device according to an embodiment of the present disclosure.

FIG. 3 is a block diagram schematically illustrating an organic light-emitting display device according to an embodiment of the present disclosure.

With reference to FIG. 3, the organic light-emitting display device may include an image processing unit 115, a data conversion unit 114, a timing controller 113, a data driver 112, a gate driver 111, and a display panel 116. The image processing unit 115 may perform various image processing tasks, such as setting a gamma voltage to realize maximum luminance according to an average image level using an RGB data signal (RGB), and may subsequently output the RGB data signal (RGB). The image processing unit 115 may output a driving signal including one or more of a vertical synchronization signal (Vsync), a horizontal synchronization signal (Hsync), a data enable signal (DES), and a clock signal CLK.

The timing controller 113 may receive a driving signal including one or more of the (optionally converted) RGB data signal, the vertical synchronization signal (Vsync), the horizontal synchronization signal (Hsync), the data enable signal (DES), and the clock signal CLK from the image processing unit 115 or the data conversion unit 114. The timing controller 113 may output a gate timing control signal GCS for controlling an operation timing of the gate driver 111 and a data timing control signal DCS for controlling an operation timing of the data driver 112 based on the driving signal. The timing controller 113 may output a data signal DATA according to the gate timing control signal CGS and the data timing control signal DCS.

In response to the data timing control signal DCS supplied from the timing controller 113, the data driver 112 may sample and latch the data signal DATA supplied from the timing controller 113, may convert the signal into a gamma reference voltage, and may output the converted gamma reference voltage. The data driver 112 may output the data signal DATA through data lines DL1 to DLm. The data driver 112 may be formed as an integrated circuit (IC).

In response to the gate timing control signal CGS supplied from the timing controller 113, the gate driver 111 may output a gate signal while shifting a level of a gate voltage. The gate driver 111 may output the gate signal through gate lines (GL1 to GLn). The gate driver 111 may be formed as an IC or may be formed in a gate-in-panel (GIP) manner in the display panel 116.

The display panel 116 may include a pixel having a red subpixel SPr, a green subpixel SPg, and a blue subpixel SPb. That is, a single pixel P may include RGB subpixels SPr, SPg, and SPb. However, the configuration of the display panel 116 is not limited thereto, and may, for example, further include a white subpixel.

Figure 4:
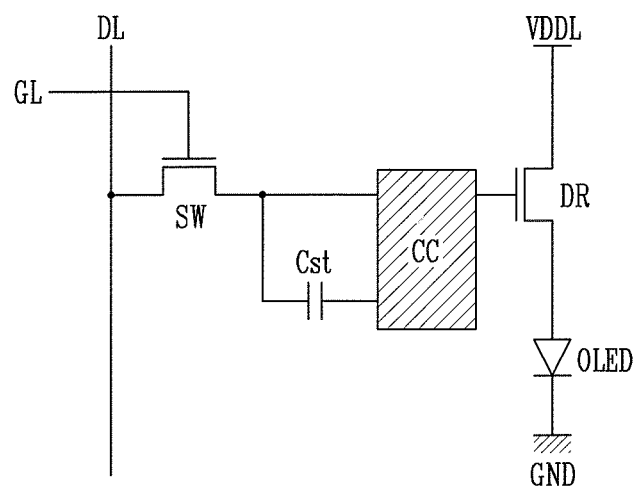
FIG. 4 is an view illustrating the circuit configuration of a subpixel in according to an embodiment of the present disclosure.

FIG. 4 is a view illustrating a configuration of a circuit regarding a subpixel of an organic light-emitting display device according to an embodiment of the present disclosure.

As shown in the FIG. 4 example, the subpixel may have a 2T (transistor)-1C (capacitor) structure, including a switching transistor, a driving transistor, a capacitor, and an organic light-emitting diode, for example. However, the subpixel is not limited thereto, and can be modified to have a structure of, e.g., 3T-1C, 4T-2C, or 5T-2C in a case in which a compensation circuit is added.

With reference to FIG. 4, in the organic light-emitting display device, the subpixel region may be defined by a gate line GL arranged in a first direction and a data line DL and a driving power line VDDL arranged to be spaced apart from one another in a second direction intersecting the first direction, e.g. perpendicular to the first direction. The single subpixel may include a switching transistor SW, a driving transistor DR, a capacitor Cst, a compensation circuit CC, and an organic light-emitting diode (OLED). The organic light-emitting diode (OLED) may operate to emit light according to a driving current formed by the driving transistor DR.

In response to a gate signal supplied through the gate line GL, the switching transistor SW may perform a switching operation, such that a data signal supplied through the data line DL may be stored as a data voltage in the capacitor Cst. The driving transistor DR may operate to allow a driving current to flow between the driving power line VDDL and a ground line GND according to the data voltage stored in the capacitor Cst. The compensation circuit CC may provide a threshold voltage for compensation of the driving transistor DR. The compensation circuit CC may include one or more transistors and one or more capacitors. Embodiments of the present disclosure are not limited to the above-described configuration of the compensation circuit.

The organic light-emitting display device having the foregoing subpixel may be implemented as a top-emission type organic light-emitting display device, a bottom-emission type organic light-emitting display device, or a dual-emission type organic light-emitting display device. However, embodiments of the present disclosure are not limited to these types of the organic light-emitting display device.

Figure 5:
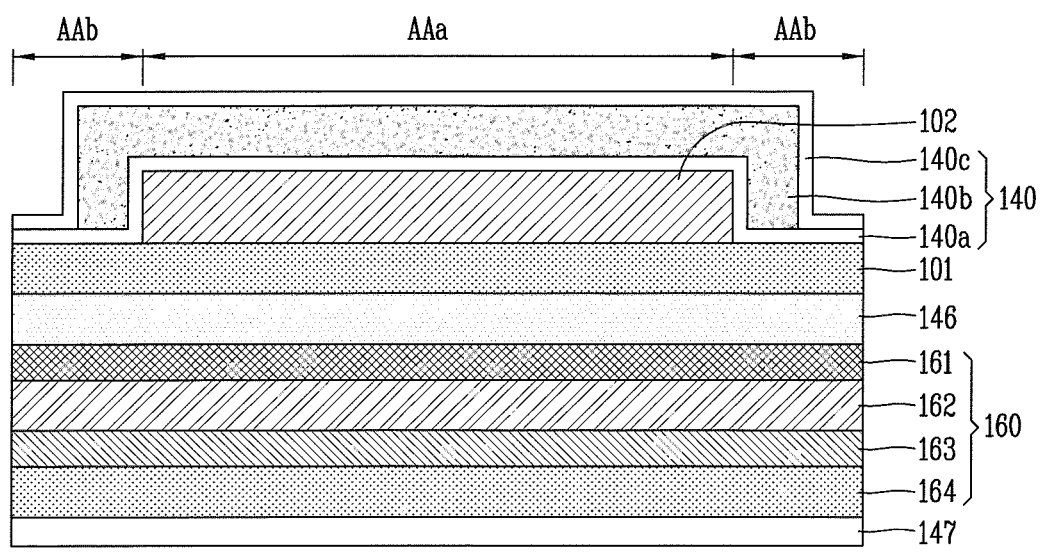
FIG. 5 is a cross-sectional view illustrating the structure of an organic light-emitting display device according to an embodiment of the present disclosure.
Figure 6:
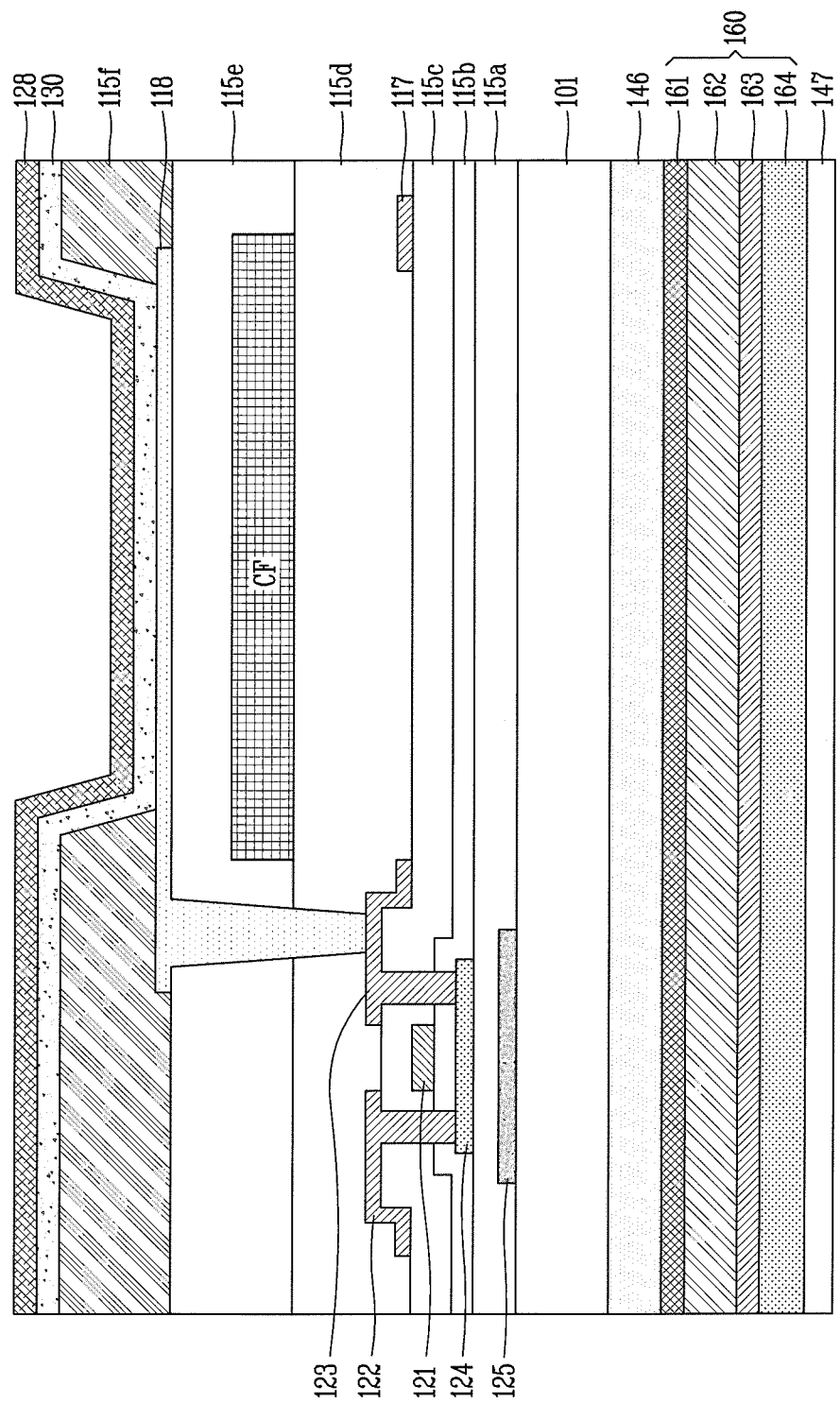
FIG. 6 is a cross-sectional view illustrating part of the organic light-emitting display device illustrated in FIG. 5.

FIG. 5 is a cross-sectional view illustrating the structure of an organic light-emitting display device according to an embodiment of the present disclosure. FIG. 6 is a cross-sectional view illustrating part of the organic light-emitting display device illustrated in FIG. 5.

In FIG. 6, a cross-section of a panel unit is illustrated. In the panel unit, a plurality of pixels may be arranged thereon in a matrix form, in which each subpixel may be selected from one of a red subpixel, a green subpixel, a blue subpixel, and a white subpixel. Here, FIG. 6 illustrates a part of a panel unit for one subpixel of the WRGB pixel as an example, and for convenience of explanation, a thin-film encapsulation layer is omitted.

An organic light-emitting display device according to an embodiment of the present disclosure may largely include a panel assembly for displaying an image and a flexible circuit board connected to the panel assembly. The panel assembly may include a panel unit divided into an active region, a pad region, and a thin-film encapsulation layer provided on the panel unit while covering the active region.

With reference to the examples of FIGS. 5 and 6, a panel unit may be disposed on an upper surface of the substrate 101. The substrate 101 may be a flexible substrate made of plastic material having excellent thermal resistance and durability, such as polyethylene terephthalate (PET), polyethylene naphthalate (PEN), polycarbonate (PC), polyallylate, polyetherimide (PEI), polyethersulphone (PES), and polyimide as a material thereof. However, embodiments of the present disclosure are limited to these materials, and various flexible materials may be used.

As illustrated in FIG. 6, in a bottom-emission device, an image may be projected toward the substrate 101, and the substrate 101 should be formed of a transparent material, but the present disclosure is not limited thereto. In a top-emission device, an image is projected toward a direction opposite to the substrate 101; in such a case, the substrate 101 may not be necessarily formed of a transparent material, although it may be permitted.

Furthermore, the active region may be disposed with a plurality of subpixels, and divided into a pixel section (AAa) having a plurality of subpixels for displaying an image, and an outer peripheral section (AAb) formed at an outer periphery of the pixel section (AAa) for transmitting signal from the outside to the pixel section (AAa). Here, the thin-film encapsulation layer 140 may be formed on the panel unit while covering part of the pixel section (AAa) and the outer peripheral section (AAb).

The subpixels may be disposed in a matrix form, and a driving element, such as a scan driver, a data driver, and the like for driving pixels and other components, may be located in an outer region of the active region. Furthermore, a panel element 102 may be disposed on an upper surface of the substrate 101 in the pixel section (AAa). For convenience of explanation, the term "panel element 102" may commonly refer to an organic light-emitting diode and a TFT array for driving the organic light-emitting diode.

With reference to FIG. 6, each subpixel may include an organic light-emitting diode and an electronic device electrically connected to the organic light-emitting diode. The electronic device may include at least two TFTs, a storage capacitor, and the like. The electronic devices may be electrically connected to lines to receive and drive an electric signal from a driving device outside the panel unit. The arrangement of the electronic devices and the lines electrically connected to the organic light-emitting diode may be referred to as a "TFT array."

Although only an organic light-emitting diode for one subpixel and a driving TFT for driving the organic light-emitting diode are illustrated in the FIG. 6 example, it is merely for convenience of explanation, and embodiments of the present disclosure are not limited thereto. Embodiments may further include a plurality of TFTs, storage capacitors, and various lines.

The TFT illustrated in FIG. 6 is a top-gate type TFT, and may include a light shielding layer 125, an active layer 124, a gate electrode 121, and source/drain electrodes 122 and 123 placed in order, but embodiments of the present disclosure are not limited to the described types of TFT.

The organic light-emitting diode may include a first electrode 118, an organic compound layer 130, and a second electrode 128. The organic compound layer 130 may further include various organic layers for efficiently transferring carriers, such as holes or electrons, in a light-emitting layer on which light emission occurs.

The organic layers may include a hole injection layer and a hole transport layer disposed between the first electrode 118 and the light-emitting layer, and an electron injection layer and an electron transport layer may be disposed between the second electrode 128 and the light-emitting layer. As described above, the first electrode 118 formed of a transparent oxide may be formed on the TFT array, and the organic compound layer 130 and the second electrode 128 may be sequentially deposited on the first electrode 118.

Based on the foregoing structure, in the organic light-emitting diode, holes injected from the first electrode 118 and electrons injected from the second electrode 128 are coupled to each other at the light-emitting layer through the transport layers for each transportation, and then moved to a low energy level, thereby generating light with a wavelength corresponding to an energy difference at the light-emitting layer.

Here, the organic light-emitting display device may be divided into an RGB independent light-emitting method, a method of using a white OLED (WOLED) and an RGB color filter, and a color conversion method according to a method of implementing full color. Among them, the RGB independent light-emitting method has an advantage of implementing high efficiency and high color purity, but also has a disadvantage of having difficulty in implementing a large-sized display due to low resolution.

On the contrary, a white organic light-emitting display device using a WOLED and an RGB color filter (CF) illustrated in the example of FIG. 6 may have high resolution, and may be advantageous in implementing a large-sized display with a simple process. However, embodiments of the present disclosure are not necessarily limited thereto.

Furthermore, a TFT may include a switching transistor and a driving transistor. The switching transistor may be connected to a scan line and a data line 117, and may transmit a data voltage inputted to the data line 117 according to a switching voltage inputted to the scan line. A storage capacitor may be connected to the switching transistor and a power line, and may store a voltage corresponding to a difference between a voltage received from the switching transistor and a voltage supplied to the power line.

The driving transistor may be connected to the power line and storage capacitor to supply an output current in proportion to the square of a difference between a voltage stored in the storage capacitor and a threshold voltage to the organic light-emitting diode; the organic light-emitting diode emits light by the output current. The driving transistor may include an active layer 124, a gate electrode 121, and source/drain electrodes 122, 123. The first electrode 118 of the organic light-emitting diode may be connected to the drain electrode 123 of the driving transistor. For example, the driving transistor may include a light shielding layer 125 formed on the substrate 101 and a buffer layer 115a formed on the light shielding layer 125.

The TFT may be an oxide TFT formed of a metal oxide, and the light shielding layer 125 may be formed in a region corresponding to the active layer 124 of each TFT. In an oxide TFT, the electrical or chemical characteristics may change when external light is introduced into the active layer 124. The light shielding layer 125 can block the active layer 124 from external light, and may prevent the visibility and contrast ratio characteristics from being reduced due to the reflection of external light.

Furthermore, the driving transistor may include the active layer 124 formed on the buffer layer 115a and a first insulating layer 115b formed on the substrate 101 formed with the active layer 124. Furthermore, the driving transistor may include the gate electrode 121 formed on the first insulating layer 115b, a second insulating layer 115c formed on the substrate 101 formed with the gate electrode 121, and the source/drain electrodes 122, 123 formed on the second insulating layer 115c and electrically connected to the source/drain region of the active layer 124 through a first contact hole. A third insulating layer 115d may be formed on the substrate 101 formed with the driving transistor.

In addition, a color filter (CF) may be formed on the third insulating layer 115d. The color filter (CF) of each subpixel may have a red, green, or blue color. Furthermore, in a subpixel for implementing white, the color filter (CF) can be removed. Red, green, and blue may be arranged in various ways, and a black matrix formed of a material capable of absorbing external light may be provided between portions of the color filter (CF).

In case of a bottom-emission device, the color filter (CF) may be located at a lower portion of the first electrode 118. A fourth insulating layer 115e may be formed on the substrate 101 formed with the color filter (CF). The drain electrode 123 of the driving transistor may be electrically connected to the first electrode 118 through a second contact hole formed on the third insulating layer 115d and fourth insulating layer 115e.

The first electrode 118 may be an anode electrode, and may be formed of a transparent conductive material having a relatively high work function, for example, a metal oxide, such as indium tin oxide (ITO) or indium zinc oxide (IZO); a mixture of a metal and an oxide, such as ZnO:Al or SnO$_2$:Sb; a conductive polymer, such as poly(3-methylthiophene), poly[3,4-(ethylene-1,2-dioxy)thiophene] (PEDT), polypyrrole, and polyaniline; or the like. Furthermore, the first electrode 118 may be formed of carbon nano tube (CNT), graphene, silver nano wire, or the like.

In addition, a bank 115f may be formed at a boundary between subpixel regions at an upper portion of the fourth insulating layer 115e. In other words, the bank 115f may have a lattice structure in a matrix form as a whole, may surround an edge of the first electrode 118, and may expose part of the first electrode 118.

The organic compound layer 130 of the foregoing organic light-emitting diode may be formed on the entire surface of the substrate 101. In this case, a patterning process may be omitted for simplifying the process. However, embodiments of the present disclosure are not necessarily limited thereto. For example, the organic compound layer 130 may be formed on the first electrode 118 between the banks 115f.

The second electrode 128 may be formed on the organic compound layer 130 of the display area. The second electrode 128 may be a cathode electrode, and may be formed of a material having a relatively low work function. In a bottom-emission device, the second electrode 128 may be configured with a first metal, a second metal such as silver (Ag), or the like, as an example, a single layer with an alloy of magnesium (Mg), or the like, at a predetermined ratio as an example or a multi-layer thereof.

A capping layer (not shown) formed of an organic material, such as a polymer, or the like, over the entire surface of the substrate 101 of the pixel section may be formed at an upper portion of the substrate 101 formed with the second electrode 128. However, embodiments of the present disclosure are not necessarily limited thereto, and the capping layer may not be formed thereon.

The capping layer may have a specific refractive index to collect light to enhance the emission of light in a top-emission device or a bottom-emission device, and may perform the role of a buffer with respect to the second electrode 128 of the organic light-emitting diode in a bottom-emission device.

The capping layer can be an optical adjustment layer. The capping layer may adjust a refractive index difference from the outside to increase the reflectance on a boundary surface between the capping layer and the outside. Through an increase of the reflectance, the capping layer may exhibit a micro-cavity effect at a specific wavelength. In one example, the capping layer may be formed with a different thickness for each subpixel.

In addition, the thin-film encapsulation layer 140 may be formed on an upper surface of the substrate 101 to cover the panel element 102 (see FIG. 5). The organic light-emitting diode included in the panel element 102 may be formed of an organic material and may be easily deteriorated by exposure to external moisture or oxygen. Accordingly, the panel element 102 should be sealed to protect the organic light-emitting diode. The thin-film encapsulation layer 140 may have a structure in which a plurality of inorganic layers and organic layers are alternately deposited as a means for sealing the panel element 102. The panel element 102 may be sealed with the thin-film encapsulation layer 140, other than a sealing substrate, to allow the slimness and flexibility of the organic light-emitting display device. However, embodiments of the present disclosure are not necessarily limited thereto.

With regard to the thin-film encapsulation layer 140, for an example, a first passivation layer 140a, an organic layer 140b, and a second passivation layer 140c may be sequentially formed as an encapsulation means on the substrate 101 provided with the panel element 102 to constitute the thin-film encapsulation layer 140. However, as described above, the number of inorganic layers and organic layers constituting the thin-film encapsulation layer 140 may not be necessarily limited to this structure.

The first passivation layer 140a may be formed of an inorganic insulating layer, and may have a low stack coverage due to a lower TFT step. The organic layer 140b located at an upper portion of the first passivation layer 140a may perform the role of planarization, and thus the second passivation layer 140c may not be affected by a step due to a lower layer. Furthermore, a thickness of the organic layer 140b formed of a polymer may have a sufficient thickness to complement a crack due to foreign substances.

A integrated circuit chip (not shown) may be mounted in a pad region of the panel assembly having the foregoing configuration to be formed into a chip-on-glass (COG) manner. Electronic elements for processing a driving signal may be mounted on a flexible circuit board to be formed into a chip-on-film (COF) manner, and a connector for transmitting an external signal to the flexible circuit board may be provided thereon.

The flexible circuit board may be folded in a backward direction of the panel assembly to face a lower surface of the panel assembly. An isotropic conductive film may be used to electrically connect a terminal portion of the panel unit to a connection portion of the flexible circuit board.

In a bottom-emission device, an optical member 160 may be provided on a lower surface of the substrate 101 to prevent the reflection of light incident from the outside. An adhesive layer 146 having transparent and adhesive characteristics may be interposed between the substrate 101 and the optical member 160.

The optical member 160 may suppress the reflection of external light to enhance the visibility of an organic light-emitting display device, as well as minimize the loss of light emitted from the organic light-emitting diode to the outside. The optical member 160 may include a first retardation layer 161, a second retardation layer 162, and a linear polarizer 163 sequentially provided on a lower surface of the substrate 101. In addition, a passivation layer 164 may be provided on the linear polarizer 163. Furthermore, a surface treatment layer 147 including an antireflection (AR) film may be located on the passivation layer 164. The AR film may be formed through a process of wet coating (AR coating) or dry coating (AR sputter).

The first retardation layer 161 may be a blue cholesteric liquid crystal (CLC) layer. The CLC layer may form a layered structure, such as a smectic liquid crystal, but molecules with the long axis may have a parallel arrangement similar to a nematic liquid crystal within a surface. For example, the first retardation layer 161 may have a structure in which the arrangement orientation of the molecular axis is slightly deviated as advancing in a direction perpendicular to the surface, e.g., a structure in which the direction of the arranged molecules appears to orbit in a helical shape. Accordingly, the entire CLC layer may have a helical structure.

The CLC layer may selectively transmit or reflect circularly polarized light or non-polarized light. For example, the CLC layer may selectively transmit or reflect right-handed circularly polarized light or left-handed circularly polarized light. The CLC may be able to reflect or transmit circularly polarized light, depending on the handedness of the light, e.g., reflecting one circular polarization and transmitting the opposite circular polarization. For example, a right-handed CLC layer can reflect right-handed circularly polarized light and transmit left-handed circularly polarized light, but a left-handed CLC layer can reflect left-handed circularly polarized light and transmit right-handed circularly polarized light.

The second retardation layer 162 may be a quarter wave plate (QWP) for generating a phase retardation of λ/4. The optical axis of the optical element may be twisted by about ±1~3 degrees due to a process variation.

The linear polarizer 163 may have a polarization axis to linearly polarize light in the direction of the polarization axis. For example, the linear polarizer 163 may transmit light corresponding to the polarization axis, and may absorb light that does not correspond to the polarization axis. Accordingly, when light passes through the linear polarizer 163, it may be linearly polarized in the direction of the polarization axis.

The second retardation layer 162 may have an optical axis twisted by about 45° (degrees) from the polarization axis of the linear polarizer 163. The CLC layer 161 and the second retardation layer 162 may be located on the same side of the linear polarizer 163. For example, the CLC layer 161 and the second retardation layer 162 may be located between the linear polarizer 163 and the substrate 101.

The second retardation layer 162 and the linear polarizer 163 may form a circular polarizer. In other words, the optical axis of the second retardation layer 162 and the transmission axis of the linear polarizer 163 may be disposed to have an angle of 45° (degrees). Reflection may occur within the second retardation layer 162 due to external light, and the reflected light may be orthogonal to the transmission axis of the linear polarizer 163 when exiting from the organic light-emitting diode, thereby reducing reflectance.

The first retardation layer 161 (e.g., CLC layer) may be provided at a lower portion of the second retardation layer 162 (e.g., QWP) for recycling the reflected light to enhance luminance. For example, light reflected from the CLC layer may be recycled to pass through the second retardation layer 162 and the linear polarizer 163, thereby increasing transmittance.

The first retardation layer 161 may be a blue CLC. Thus, the enhancement of the blue device (light-emitting diode) may contribute to efficiency enhancement in driving full-color (WRGB), wherein the reflectance increases, but increases only at blue wavelengths. Blue is low in visibility and luminance, thus there is no large difference in the reflection visual perception.

In the aspect of a product, a lot of difficulties exist in enhancing efficiency through the development of raw materials for an element, but according to embodiments of the present disclosure, only the addition of a film layer may be required, thereby easily and quickly enhancing efficiency. Accordingly, when an embodiment of the present disclosure is combined with an high-efficiency element, it may be possible to accomplish all of high luminance, low reflectance, and low power consumption.

Figure 7A:
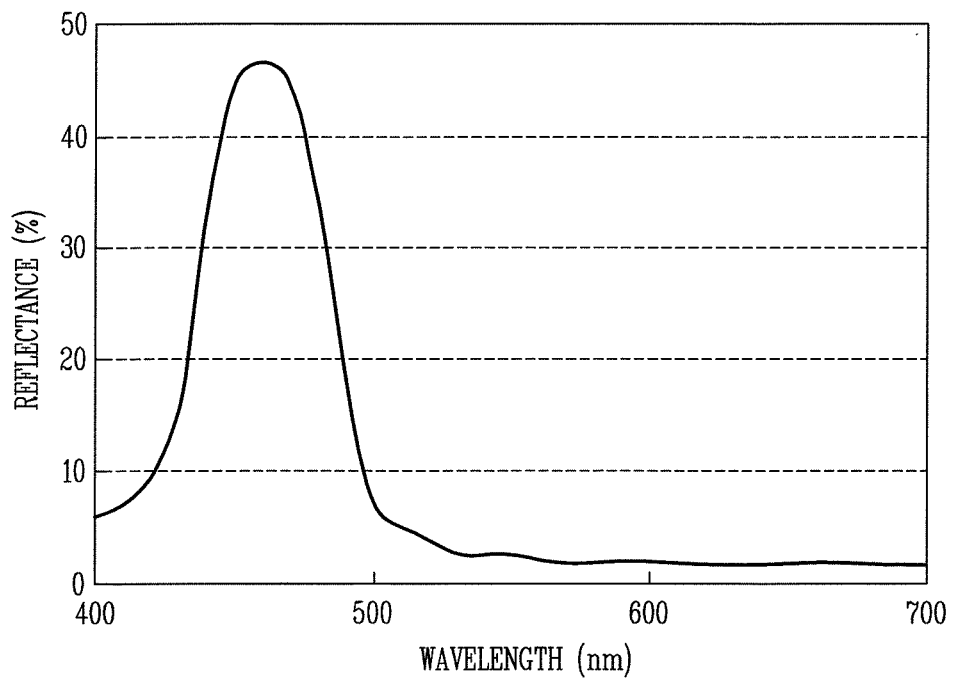
FIG. 7A is a graph of reflectance versus wideband wavelength in nanometers (nm) of a blue cholesteric liquid crystal (CLC) according to an embodiment of the present disclosure.
Figure 7B:
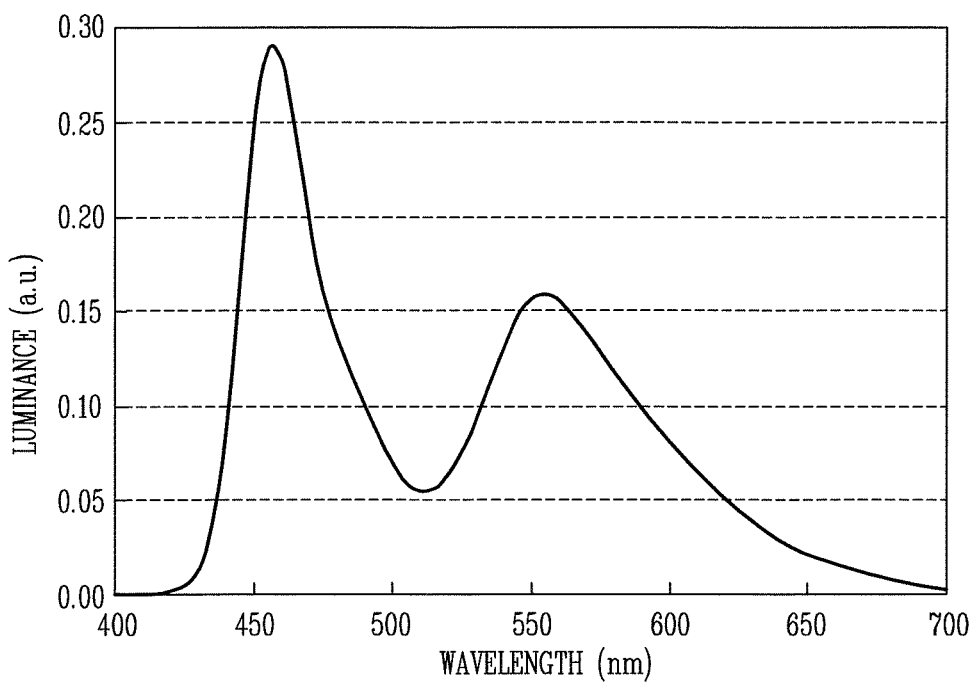
FIG. 7B is a graph of luminance versus wideband wavelength in nanometers (nm) of the organic light-emitting diode according to an embodiment of the present disclosure.

For efficiency enhancement, a blue emission peak of the element may correspond to a peak of the blue CLC. FIG. 7A is a graph of reflectance versus wideband wavelength in nanometers (nm) of a blue cholesteric liquid crystal (CLC) according to an embodiment of the present disclosure. FIG. 7B is a graph of luminance versus wideband wavelength in nanometers (nm) of an organic light-emitting diode according to an embodiment of the present disclosure.

The FIG. 7B example illustrates the white emission spectrum of an organic light-emitting diode as an example. For reference, the emission spectrum is determined by a product of a photoluminescence (PL) peak indicating an inherent color of the light-emitting layer and an emittance (EM) peak of the organic layers constituting the organic light-emitting diode.

With reference to the FIG. 7A example, a blue CLC may have a peak only within a range of blue wavelengths (430-470 nm) compared to a typical white CLC. Accordingly, the reflection peak of the blue CLC according to the present disclosure may correspond to a blue emission peak of the organic light-emitting diode, for example, 455 nm, on a white emission spectrum of an organic light-emitting diode illustrated in FIG. 7B, to enhance efficiency.

Hereinafter, the operation of the organic light-emitting display device during transmission and reflection are described with reference to the drawings. First, the operation of an organic light-emitting display device during transmission is be described. For reference, in the examples described herein, only light with blue wavelengths may be used for the recycling of light by the blue CLC as the blue CLC is applied to the first retardation layer, but for convenience of explanation, it will not be clearly described in a distinguished manner.

Figure 8:
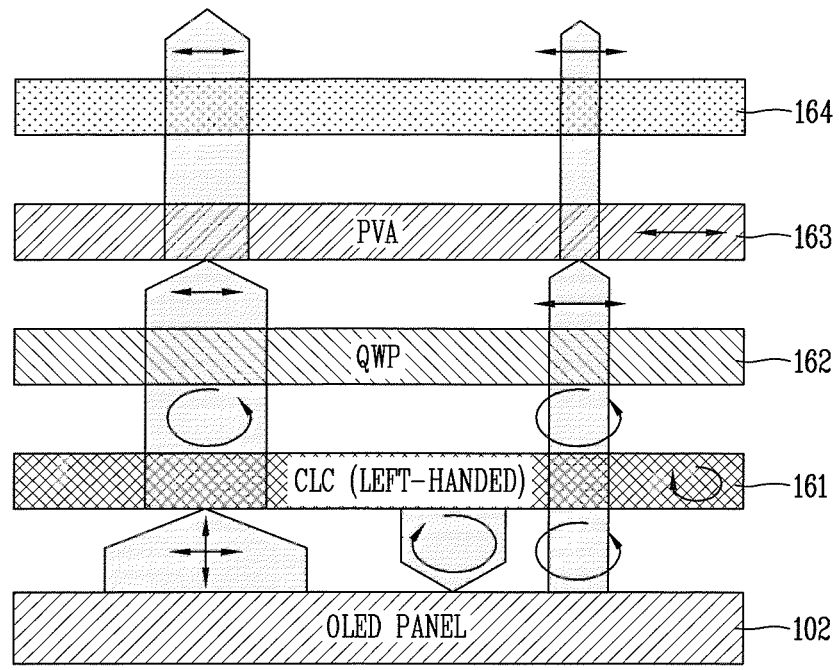
FIG. 8 is a view exemplarily illustrating a polarization phase change of light during transmission in an organic light-emitting display device according to an embodiment of the present disclosure.

FIG. 8 is a view illustrating a polarization phase change of light during transmission in an organic light-emitting display device according to an embodiment of the present disclosure.

With reference to FIG. 8, when a voltage is applied to the organic light-emitting display device (e.g., light generated from an organic light-emitting diode is in a non-polarized state in which various phases are mixed), light emitted from the light-emitting layer may be directed to the first retardation layer 161 through the first electrode 118 and the color filter CF.

The first retardation layer 161 may be a left-handed CLC layer, which can reflect left-handed circularly polarized light back to the first electrode, but may transmit right-handed circularly polarized light.

Light from the first retardation layer 161 passing through the second retardation layer 162 has a 45-degree phase delayed to be linearly polarized, and the linearly polarized light (indicated as ↔) then travels toward the outside by sequentially passing through the linear polarizer 163 and passivation layer 164.

On the other hand, when right-handed circularly polarized light is directed to the first electrode or the second electrode, it will be converted into left-handed circularly polarized light. Furthermore, light may be reflected by lines, as well as the electrodes in the organic light-emitting diode. The left-handed circularly polarized light may sequentially pass through the first retardation layer 161, the second retardation layer 162, the linear polarizer 163, and the passivation layer 164, and then may be emitted to the outside.

As described above, an amount of light lost as light is projected from the organic light-emitting diode to the outside may be relatively very small due to the recycling of light by the first retardation layer 161, and thereby transmittance may increase. Next, the light travelling from the outside to the optical member is described.

Figure 9:
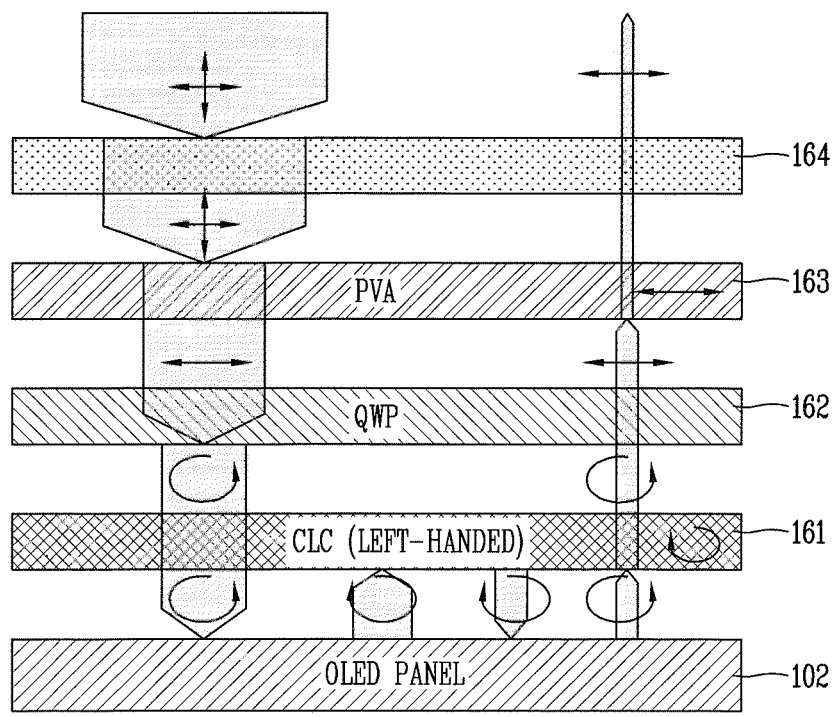
FIG. 9 is a view exemplarily illustrating a polarization phase change of light during reflection in the organic light-emitting display device according to an embodiment of the present disclosure.

FIG. 9 is a view illustrating a polarization phase change of light during reflection in the organic light-emitting display device according to an embodiment of the present disclosure.

With reference to FIG. 9, external light (in non-polarized state) may be linearly polarized in a polarization axis direction (indicated as ↔) of the linear polarizer 163 while passing through the linear polarizer 163. The linearly polarized light is converted into circularly polarized light while passing through the second retardation layer 162 (e.g., quarter wave plate). An optical axis of the second retardation layer 162 may be twisted by about 45° (degrees) from a polarization axis of the linear polarizer 163.

Because an angle between the optical axis of linearly polarized light and the optical axis of the second retardation layer 162 is about 45° (degrees), linearly polarized light may be converted into circularly polarized light while passing through the second retardation layer 162. The circularly polarized light passing through the second retardation layer 162 may be described herein as being left-handed circularly polarized light, but embodiments of the present disclosure are not limited thereto. For example, the circularly polarized light passing through the second retardation layer may be right-handed circularly polarized light.

Furthermore, the left-handed circularly polarized light can pass through the blue CLC layer 161, but may be converted into right-handed circularly polarized light while reflected on the first electrode or the second electrode. Then, the right-handed circularly polarized light may be reflected by the blue CLC layer 161 and may be incident back to the OLED panel 102.

Then, the right-handed circularly polarized light directed back to the OLED 102 may be converted into left-handed circularly polarized light while being reflected on the first electrode or the second electrode. The left-handed circularly polarized light can sequentially pass through the first retardation layer 161, the second retardation layer 162, the linear polarizer 163, and the passivation layer 164, and then may be emitted to the outside. During the transmission, the final amount of the light emitted to the outside may be very small because it may have been reflected for several times during transmitting, thereby effectively suppressing the reflection of external light.

Hereinafter, in an optical member for luminance enhancement according to the present disclosure and an organic light-emitting display device having the same, the luminance/reflectance characteristics according to the wavelengths of a blue CLC and the luminance/reflectance characteristics according to the transmittance of a linear polarizer are described in detail.

Figures 11, 12:
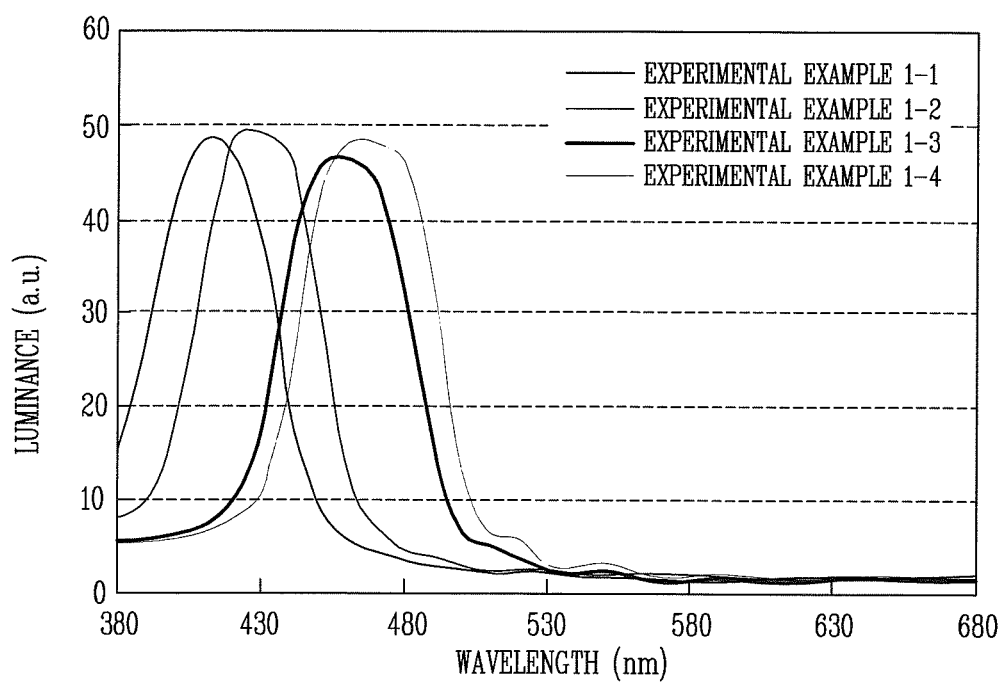
FIG. 11 is a comparison table illustrating the reflection characteristics of an organic light-emitting display device according to comparative and experimental examples.
FIG. 12 is a graph of luminance versus wideband wavelength in nanometers (nm) of the experimental examples of organic light-emitting display devices in FIG. 10 and FIG. 11.

FIG. 10 is a comparison table illustrating the luminance characteristics of organic light-emitting display devices according to comparative and experimental examples. FIG. 11 is a comparison table illustrating the reflection characteristics of an organic light-emitting display device according to comparative and experimental examples. FIG. 12 is a graph of luminance versus wideband wavelength in nanometers (nm) of the experimental examples of organic light-emitting display devices in FIG. 10 and FIG. 11.

FIG. 10 is a table of comparing the luminance characteristics of Comparative Example 1, which is not provided with a blue CLC, with those of Experimental Examples 1-1, 1-2, 1-3, and 1-4, each provided with the blue CLC according to embodiments of the present disclosure. Furthermore, FIG. 11 illustrates a table of comparing the reflection characteristics of Comparative Example 1 with those of Experimental Examples 1-1, 1-2, 1-3, and 1-4.

Here, the reflection peaks of the blue CLC according to the Experimental Examples 1-1, 1-2, 1-3, and 1-4 provided with the blue CLC are 410 nm, 430 nm, 455 nm, and 470 nm, respectively, for example. Furthermore, the luminance characteristics shown in FIG. 10 are displayed through RGB color coordinates. The RGB color coordinates denote red, green, and blue coordinates in an xy color space in the red, green, and blue maximum luminance conditions.

With reference to FIG. 10, the Experimental Examples 1-1, 1-2, 1-3, and 1-4 provided with the blue CLC have higher efficiency than that of Comparative Example 1, which is not provided with the blue CLC. For example, efficiency increases to about 101%, 112%, 135%, and 126%, respectively, in the Experimental Examples, as compared to that of Comparative Example 1.

In other words, experiments show that the efficiency increases to 20.63 cd/A, 22.81 cd/A, 27.70 cd/A and 25.82 cd/A, respectively, in case of Experimental Examples 1-1, 1-2, 1-3, and 1-4. In comparison, the efficiency of Comparative Example 1 is 20.45 cd/A. Accordingly, when the blue CLC has an reflection peak at 430-470 nm, the efficiency of the Experimental Examples according to embodiments of the present disclosure is effective.

Furthermore, with reference to FIG. 11, the reflectance is 0.76% in Comparative Example 1, which is not provided with the blue CLC, and the reflectance is 0.80%, 0.80%, 0.88%, and 0.91%, respectively, in case of Experimental Examples 1-1, 1-2, 1-3, and 1-4 provided with the blue CLC. In other words, the reflectance can be all maintained at less than 1%, whether the blue CLC is provided or not. Because the reflectance is increased only at blue wavelengths, but blue is low in the visibility and luminance, there no large difference in the reflection visual perception.

FIG. 13 is a comparison table illustrating the luminance characteristics of linear polarizer according to comparative and experimental examples. FIG. 14 is a comparison table illustrating the reflection characteristics of the organic light-emitting display devices in FIG. 13.

FIG. 13 illustrates a table comparing the luminance characteristics of Comparative Example 2, which is not provided with a blue CLC, with those of Experimental Examples 2-1, 2-2, and 2-3 that are provided with the blue CLC according to embodiments of the present disclosure. Furthermore, FIG. 14 illustrates a table comparing the reflection characteristics of Comparative Example 2 with those of Experimental Examples 2-1, 2-2, and 2-3.

Here, a case is illustrated in which the transmission of a linear polarizer according to Comparative Example 2 is 43%, for example. The transmittance of the linear polarizer according to Experimental Examples 2-1, 2-2, and 2-3 provided with the blue CLC is 43%, 45%, and 48%, respectively, for example. With reference to FIG. 13, efficiency increases as the transmittance of the linear polarizer increases in case of Experimental Examples 2-1, 2-2, and 2-3 provided with the blue CLC, as compared to Comparative Example 2, which is not provided with the blue CLC.

For example, the efficiency increases to 26.73 cd/A, 29.38 cd/A, and 30.43 cd/A, respectively, in Experimental Examples 2-1, 2-2 and 2-3. In comparison, the efficiency of Comparative Example 2 is 20.06 cd/A. Therefore, the efficiency increases to about 131%, 144%, and 149%, respectively, in Experimental Examples 2-1, 2-2, and 2-3 as compared to Comparative Example 2. Furthermore, with reference to FIG. 14, that the reflectance is 0.76% in Comparative Example 2, which is not provided with the blue CLC layer, and the reflectance is 0.88%, 0.97%, and 1.87%, respectively, in case of Experimental Examples 2-1, 2-2, and 2-3 that are provided with the blue CLC layer.

In other words, the reflectance can be maintained at a level of less than 1% when the transmittance of the linear polarizer is 43-45%, even when provided with the blue CLC layer. For reference, the transmittance of the linear polarizer can vary according to an amount of iodine and a drawing condition, and it has a trade-off relationship in which a degree of the polarization decreases as the transmittance increases.

Next, a relationship between the efficiency enhancement of a blue device and the efficiency enhancement of a full white device is provided. In the case of an organic light-emitting display device configured with four WRGB subpixels, a white subpixel may be driven to accomplish a full-white specification (luminance/color temperature). Here, about half of a current used for the configured full-white is a current required for a white operation. For example, the efficiency of the blue device may be low, and thus the efficiency enhancement of the blue device may have a large effect on white efficiency.

For example, in a case in which about 100 nit is required for full-white luminance in the condition of color temperature 10,000 K, about 94.5 nit and 9.4 nit are required for a white subpixel and a red+blue subpixel, respectively, in a related art organic light-emitting display device (e.g., Comparative Examples 1 and 2) that is not provided with the blue CLC layer. On the other hand, about 96.7 nit and 5.6 nit are required for a white subpixel and a red+blue subpixel, respectively, in the organic light-emitting display device of the first embodiment provided with the blue CLC layer (e.g., the Experimental Examples).

Accordingly, a current of about 3 A and 2.1 A is consumed for a white subpixel and a red+blue subpixel, respectively, in the Comparative Examples, and thus 5.10 A is consumed. In contrast, a current of about 2.9 A and 1.02 A may be consumed for a white subpixel and a red+blue subpixel, respectively, an embodiment of the present disclosure, and thus 3.92 A may be consumed. Accordingly, compared to the Comparative Examples, current consumption according to embodiments of the present disclosure may be mostly maintained in a white subpixel, but may be reduced by 51% for a red+blue subpixel. Thus, the current consumption may be reduced by about 23% in total.

The efficiency at this time is about 20.06 nit/A in the Comparative Examples and 26.73 nit/A in an embodiment. At full white, efficiency increases to about 131% in an embodiment compared to the Comparative Examples.

In the above description, for convenience of explanation, a case in which the white subpixel (i.e., W subpixel) and red+blue subpixel (i.e., RB subpixel) are driven when full white is driven is taken as an example, but embodiments of the present disclosure are not necessarily limited thereto. The present disclosure may also drive a W subpixel and an RG subpixel, a W subpixel and a BG subpixel, or a W subpixel and an RGB subpixel in addition to a method of driving the W subpixel and the RB subpixel as described above when full white is driven.

Figure 16:
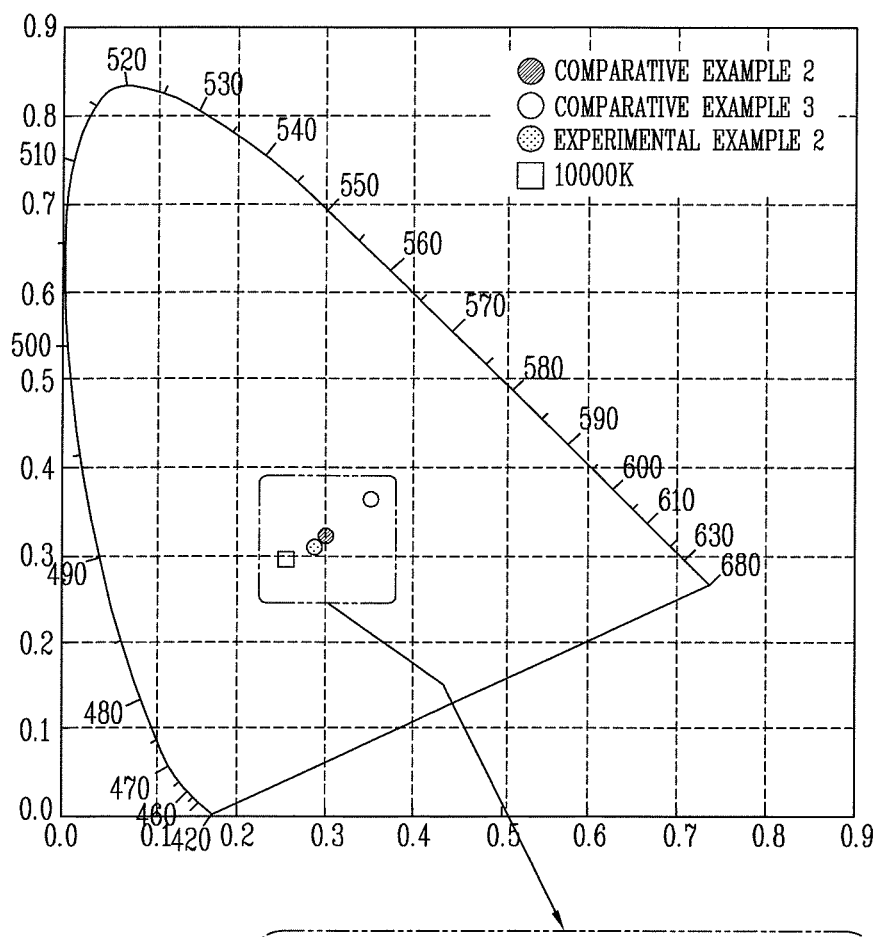
FIG. 16 is a graph illustrating color temperature characteristics illustrated in FIG. 15 in a color system according to comparative and experimental examples.
Figure 16:
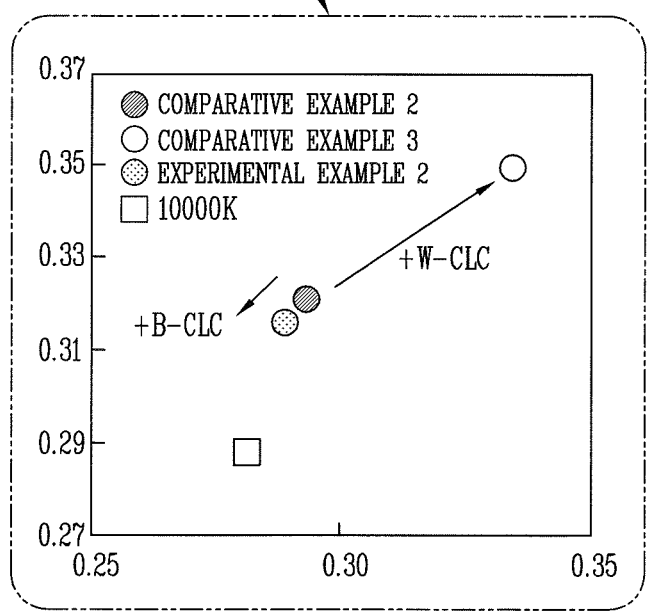

FIG. 15 is a comparison table illustrating the efficiency and color temperature characteristics of a white cholesteric liquid crystal (CLC) and a blue cholesteric liquid crystal (CLC) according to comparative and experimental examples. FIG. 16 is a graph illustrating color temperature characteristics illustrated in FIG. 15 in a color system according to comparative and experimental examples.

As shown in FIG. 15, Comparative Examples 2 and 3, and Experimental Example 2 illustrate examples that are each provided with a linear polarizer having a transmittance of 43%, and Comparative Example 3 and Experimental Example 2 illustrate cases respectively provided with a white CLC and a blue CLC. The Comparative Example 2, as discussed above, has no CLC layer.

With reference to FIGS. 15 and 16, a relative efficiency of Comparative Example 3 based on Comparative Example 2 is 117%, 146%, 126%, and 117% for a white, a red, a green, and a blue subpixel, respectively. Furthermore, a relative efficiency of Experimental Example 2 based on Comparative Example 2 is 131%, 101%, 100%, and 114% for a white, a red, a green, and a blue subpixel, respectively. Accordingly, efficiency is further increased in an embodiment of the present disclosure that has blue CLC layer as compared to Comparative Example 3 that has a white CLC.

Furthermore, the color temperature is 7,800 K, 5,400 K, and 8,200 K in Comparative Example 2, Comparative Example 3, and Experimental Example 2, respectively. The target temperature is 10,000 K. In this manner, the color temperature of a white subpixel on the device is decreased when the white CLC is applied, but the color temperature is increased when the blue CLC is applied. Therefore, the color temperature of the one with the blue CLC is closer to the target color temperature than the other examples.

Here, in the case of the white CLC, the blue subpixel should be further turned on to approach the target color coordinate due to a decrease of the color temperature when full white is driven, thereby leading to a result of not reducing but rather increasing current consumption, compared to a case with no CLC. Accordingly, the effect of current consumption reduction and lifespan improvement of the CLC is relatively lower than that of the blue CLC of the present disclosure. Furthermore, according to Bragg diffraction, there tends to be a shift to a short wavelength at a viewing angle based on a single CLC, but in case of an embodiment of the present disclosure to which the blue CLC is applied, the effect thereof is relatively insignificant.

Figure 17:
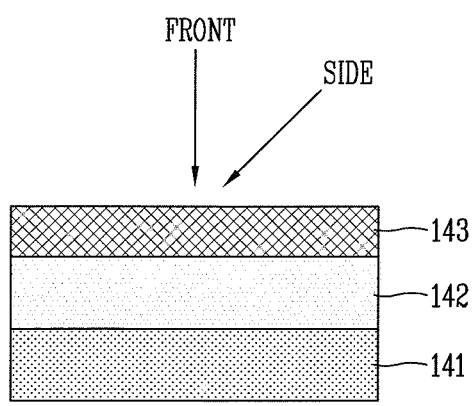
FIG. 17 is a view illustrating the reflection visual perception of a cholesteric liquid crystal (CLC).

FIG. 17 is a view illustrating the reflection visual perception of a cholesteric liquid crystal (CLC).

FIG. 17 illustrates a sample showing the reflection visual perception of the CLC. With reference to FIG. 17, a passivation layer 142 and a CLC 143 with PSA are sequentially deposited on an acrylic base substrate 141 to test the reflection visual perception of the CLC. In this case, it is seen that the reflection visual perception on a lateral surface is shifted to a short wavelength regardless of the type of the CLC with respect to a front surface.

According to the following Equation, it is seen that there is relatively no visual perception in case of B-CLC in which the reflection peak is located at a short wavelength, compared to a case where light is shifted to a short wavelength on a lateral surface to reduce the visual perception in case of W-CLC, R-CLC and G-CLC.

$$\lambda(\alpha) = nSPS \cos\left[\sin^{-1}\left(\sin\frac{\alpha}{n}\right)\right] \quad \text{[Equation]}$$

In the Equation, "n" indicates a refractive index of the material, "P" indicates helical power, and "α" indicates an incident angle.

On the other hand, the reflectance that increases with the application of the CLC decreases as the reflectance of the panel assembly itself decreases, and when the panel assembly having a reflectance of about ~15% is used, the reflectance of a product to which the CLC is applied further decreases below 1%.

Figure 18:
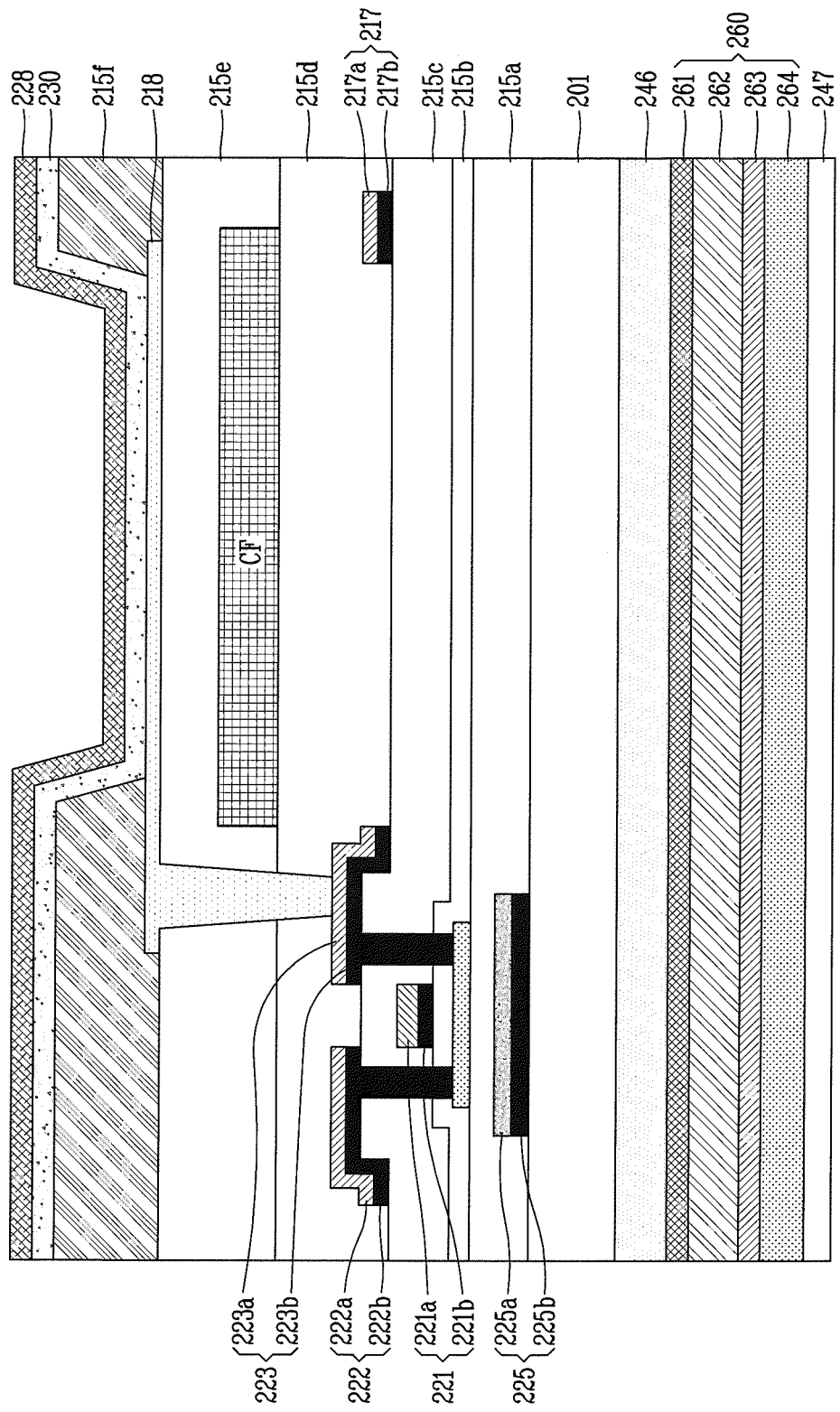
FIG. 18 is a cross-sectional view illustrating a part of the cross-sectional structure of an organic light-emitting display device according to an embodiment of the present disclosure.

FIG. 18 is a cross-sectional view illustrating a part of the structure of an organic light-emitting display device according to an embodiment of the present disclosure. An organic light-emitting display device according to an embodiment of the present disclosure illustrated in FIG. 18 is substantially the same as the configuration of the above-described embodiment of the present disclosure, except that a light-blocking layer is interposed between a line and an electrode.

FIG. 18 illustrates a part of the panel unit for one subpixel on the WRGB subpixel. For convenience of explanation, the panel unit is illustrated with no thin-film encapsulation layer.

With reference to FIG. 18, a panel unit may be disposed on an upper surface of the substrate 201. The substrate 201 may be a flexible substrate. In a bottom-emission device in which an image is projected toward the substrate 201, the substrate 201 should be formed of a transparent material, but embodiments of the present disclosure are not limited thereto. In a top-emission device, an image is projected toward a direction opposite to the substrate 201; in such a case, the substrate 201 may not be necessarily formed of a transparent material, although it is permitted.

The thin-film encapsulation layer may be formed on the panel unit while covering part of the pixel section and the outer peripheral section. Furthermore, a panel element may be disposed on an upper surface of the substrate 201 in the pixel section. As described above, for convenience of explanation, the term "panel element" may commonly refer to an organic light-emitting diode and a TFT array for driving the organic light-emitting diode.

For example, each subpixel may include an organic light-emitting diode and an electronic device electrically connected to the organic light-emitting diode. The electronic device may include at least two TFTs, a storage capacitor, and the like. The electronic devices may be electrically connected to lines to receive and drive an electric signal from a driving device outside the panel unit. The arrangement of such electronic devices and lines electrically connected to the organic light-emitting diode is referred to as a "TFT array." Although only an organic light-emitting diode for one subpixel and a driving TFT for driving the organic light-emitting diode are illustrated in the FIG. 18 example, it is merely for convenience of explanation, and embodiments of the present disclosure are not necessarily limited thereto, and may further include, e.g., a plurality of TFTs, storage capacitors, and various lines.

The TFT illustrated in the example of FIG. 18 is a top-gate type TFT, and may include a light shielding layer 225, an active layer 224, a gate electrode 221, and source/drain electrodes 222 and 223 placed in order, but embodiments of the present disclosure are not limited to these types of TFTs. The organic light-emitting diode may include a first electrode 218, an organic compound layer 230, and a second electrode 228.

The organic light-emitting display device may be classified as an RGB independent light-emitting device, a device using a WOLED and an RGB color filter, and a color conversion device for implementing full color. Among these devices, the RGB independent light-emitting device has an advantage of implementing high efficiency and high color purity, but also has a disadvantage of having difficulty in implementing a large-sized display due to low resolution.

On the contrary, a white organic light-emitting display device using a WOLED and an RGB color filter (CF), as illustrated in the FIG. 18 example, has high resolution, and is advantageous in implementing a large-sized display with a simple process. However, embodiments of the present disclosure are not necessarily limited thereto.

Furthermore, a TFT may include a switching transistor and a driving transistor. The switching transistor may be connected to a scan line and a data line 217, and may transmit a data voltage inputted to the data line 217 according to a switching voltage inputted to the scan line. A storage capacitor may be connected to the switching transistor and a power line, and may store a voltage corresponding to a difference between a voltage received from the switching transistor and a voltage supplied to the power line.

The driving transistor may be connected to the power line and storage capacitor to supply an output current in proportion to the square of a difference between a voltage stored in the storage capacitor and a threshold voltage to the organic light-emitting diode, and the organic light-emitting diode may emit light by the output current.

The driving transistor may include the active layer 224, the gate electrode 221, and the source/drain electrodes 222, 223, and the first electrode 218 of the organic light-emitting diode may be connected to the drain electrode 223 of the driving transistor. For example, the driving transistor may include the light shielding layer 225 formed on the substrate 201 and a buffer layer 215a formed on the light shielding layer 225.

Furthermore, the driving transistor may include the active layer 224 formed on the buffer layer 215a and a first insulating layer 215b formed on the substrate 201 formed with the active layer 224. Furthermore, the driving transistor may include the gate electrode 221 formed on the first insulating layer 215b, a second insulating layer 215c formed on the substrate 201 formed with the gate electrode 221, and the source/drain electrodes 222, 223 formed on the second insulating layer 215c and electrically connected to the source/drain region of the active layer 224 through a first contact hole. A third insulating layer 215d may be formed on the substrate 201 formed with the driving transistor.

In addition, a color filter (CF) may be formed on the third insulating layer 215d. The color filter (CF) of each subpixel may have a red, green, or blue color. Furthermore, in a subpixel implementing a white color output, the color filter (CF) may not be formed thereon. Red, green, and blue may be arranged in various ways, and a black matrix formed of a material capable of absorbing external light may be provided between the color filter (CF) portions. In a bottom-emission device, the color filter (CF) may be located at a lower portion of the first electrode 218.

A fourth insulating layer 215e may be formed on the substrate 201 formed with the color filter (CF). Here, the drain electrode 223 of the driving transistor may be electrically connected to the first electrode 218 through a second contact hole formed on the third insulating layer 215d and fourth insulating layer 215e.

In addition, a bank 215f may be formed at a boundary between subpixel regions at an upper portion of the fourth insulating layer 215e. In other words, the bank 215f may have a lattice structure in a matrix form as a whole, may surround an edge of the first electrode 218, and may expose part of the first electrode 218. The bank 215f may be a black bank formed of a black-based material, and the bank 215f may be formed of a material capable of absorbing light or coated with a light absorber to perform the role of absorbing light introduced from the outside.

For example, the bank 215f may include one or more of a black pigment in which carbon black is exclusively used or two or more coloring pigments are mixed, a black dye in which a black dye is exclusively used or two or more different dyes are mixed to produce black, a black resin, graphite powder, gravure ink, black spray, and black enamel. These are examples, only, and embodiments are not limited thereto. The bank 215f may absorb light introduced from the outside, thereby having an effect of preventing visibility and contrast ratio, as well as enhancing luminance.

The organic compound layer 230 of the foregoing organic light-emitting diode may be formed on the entire surface of the substrate 201. In this case, a patterning process may be omitted for simplifying the process. However, embodiments of the present disclosure are not necessarily limited thereto; the organic compound layer 230 may be formed on the first electrode 218 between the banks 215f.

The second electrode 228 may be formed on the organic compound layer 230 of the display area. A capping layer formed of an organic material, such as a polymer or the like, over the entire surface of the substrate 201 of the pixel section may be formed at an upper portion of the substrate 201 formed with the second electrode 228. However, embodiments of the present disclosure are not necessarily limited thereto, and the capping layer may not be formed thereon. In addition, the thin-film encapsulation layer may be formed on an upper surface of the substrate 201 to cover the panel element.

In an organic light-emitting display device according to an embodiment of the present disclosure having the foregoing configuration, in a bottom-emission device, an optical member 260 according to an embodiment of the present disclosure may be provided on a lower surface of the substrate 201 to prevent the reflection of light incident from the outside. Here, an adhesive layer 246 having transparent and adhesive characteristics may be interposed between the substrate 201 and the optical member 260. However, embodiments of the present disclosure are not limited to the adhesive layer 246. For example, when a curable adhesive material is contained in the optical member 260, the adhesive layer 246 may not be required.

The optical member 260 may suppress the reflection of external light to enhance the visibility of an organic light-emitting display device, as well as minimize the loss of light emitted from the organic light-emitting diode to the outside. The optical member 260 may include a first retardation layer 261, a second retardation layer 262, and a linear polarizer 263 sequentially provided on a lower surface of the substrate 201 in a same manner as in the optical member 160 in the FIG. 6 example. A passivation layer 264 may be provided on the linear polarizer 263. Furthermore, a surface treatment layer 247 including an antireflection (AR) film may be located on the passivation layer 264.

The first retardation layer 261 may be a blue cholesteric liquid crystal (CLC) layer. The second retardation layer 262 may be a quarter-wave plate (QWP) for generating a phase retardation of $\lambda/4$. The linear polarizer 263 may have a polarization axis to linearly polarize light in the direction of the polarization axis.

The CLC layer 261 and the second retardation layer 262 may be located on the same side of the linear polarizer 263. For example, the CLC layer 261 and the second retardation layer 262 may be located between the linear polarizer 263 and the substrate 201.

The second retardation layer 262 may have an optical axis twisted by about 45° (degrees) from the polarization axis of the linear polarizer 263.

The second retardation layer 262 and the linear polarizer 263 may form a circular polarizer. In other words, the optical axis of the second retardation layer 262 and the transmission axis of the linear polarizer 263 are disposed to have an angle of 45° (degrees). Reflection may occur within the second retardation layer 262, and the reflected light is orthogonal to the transmission axis of the linear polarizer 263 when exiting from the organic light-emitting diode, thereby reducing reflectance.

The first retardation layer 261 (e.g., CLC layer), may be provided at a lower portion of the second retardation layer 262 (e.g., QWP) for recycling the reflected light to enhance luminance, which is substantially the same as the configuration described above for the FIG. 6 example. In other words, light reflected from the CLC layer may be recycled to pass through the second retardation layer 262 and the linear polarizer 263, thereby further increasing transmittance.

The first retardation layer 261 may be a blue CLC; thus, the enhancement of the blue device (light-emitting diode) may contribute to efficiency enhancement in driving full-color, wherein the reflectance increases, but increases only at blue wavelengths. Blue is low in visibility and luminance; thus, there is no large difference in the reflection visual perception.

Moreover, the light-blocking layer may be interposed between the line and the electrode, while at the same time the bank 215f may be applied thereto to reduce the reflectance of the panel assembly itself, thereby further reducing the overall reflectance by less than 1%. In other words, a low reflection technology with the bank 215f and a low reflection metal layer may be applied to the second embodiment of the present disclosure.

For example, the entire portion or a part of at least one of a data line 217, a gate electrode 221 and a source/drain electrode 222, 223 may have a multi-layer structure formed with a conductive layer 225a, 217a, 221a, 222a, 223a and one or more light-blocking layers 225b, 217b, 221b, 222b, 223b. The light-blocking layer 225b, 217b, 221b, 222b, 223b may be formed of a material for absorbing external light introduced through the substrate 201 or may be coated with a light absorber.

For example, the light-blocking layer 225b, 217b, 221b, 222b, 223b may be a metal oxide, such as ITO, IZO, and the like, although embodiments are not limited thereto. Light introduced from the outside may be divided into light reflected on an interface of the light-blocking layers 225b, 217b, 221b, 222b, 223b and light transmitted through the light-blocking layer 225b, 217b, 221b, 222b, 223b and reflected on an interface of the conductive layer 225a, 217a, 221a, 222a, 223a. In this manner, destructive interference may occur between light reflected on different interfaces. Thus, the introduced light is not returned again to the outside of the panel element. Accordingly, it may be possible to prevent visibility from being deteriorated due to external light.

Furthermore, the light-blocking layer 225b, 217b, 221b, 222b, 223b may be formed of a material having a black-based color absorbing light. For example, the light-blocking layer 225b, 217b, 221b, 222b, 223b may be any one of molybdenum (Mo), chromium (Cr), titanium (Ti), niobium (Nb), manganese (Mn), tantalum (Ta), and/or an alloy thereof. However, embodiments of the present disclosure are not necessarily limited thereto. For example, another metal capable of absorbing light may be used. Accordingly, it may be possible to prevent external light from being reflected again to the outside.

FIG. 18 illustrates an example in which one light-blocking layer 225b, 217b, 221b, 222b, 223b is formed as an example, for convenience of explanation. However, embodiments of the present disclosure are not necessarily limited thereto, and may be formed with a multi-layer structure.

FIGS. 19A through 19D are views illustrating examples of a light-blocking layer in an organic light-emitting display device according to embodiments of the present disclosure.

Here, a low reflection metal layer having a light-blocking layer illustrated in FIGS. 19A through 19D may be applicable to a light shielding layer, a scan line and a data line a gate electrode and a source/drain electrode.

Figure 19A:
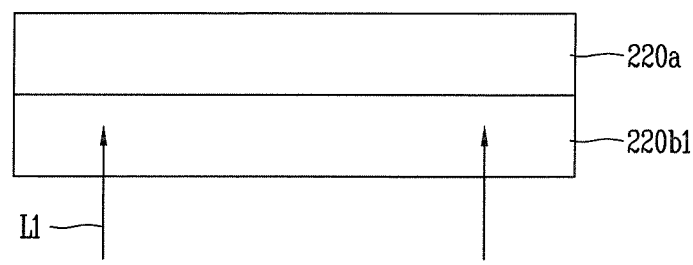
FIGS. 19A through 19D are views illustrating examples of a light-blocking layer in an organic light-emitting display device according to embodiments of the present disclosure.
Figure 19B:
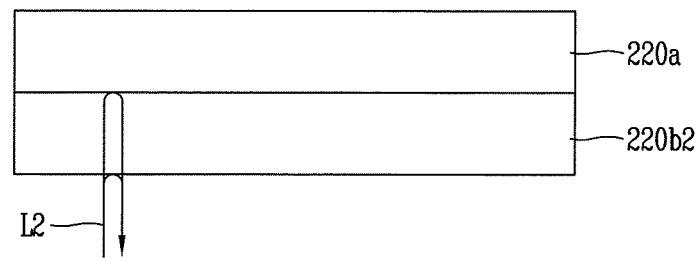

FIGS. 19A and 19B illustrate examples in which the low reflection metal layer is formed with a conductive layer and one light-blocking layer. With reference to FIG. 19A, the low reflection metal layer may be formed of a black-based material capable of allowing the light-blocking layer 220b1 to absorb light, or may be coated with a black-based material, thereby absorbing first light (L1) introduced from the outside, e.g., ambient light.

With reference to FIG. 19B, the low reflection metal layer may be formed of a metal oxide or an alloy including a metal and a metal oxide capable of allowing the light-blocking layer 220b2 to absorb light, thereby reflecting second light (L2) introduced from the outside. For example, the second light (L2) (reflected on a surface of the light-blocking layer 220b2) and the second light (L2) (transmitted through the light-blocking layer 220b2 and reflected on an interface between the conductive layer 220a and the light-blocking layer 220b2) may cause destructive interference to each other, thereby blocking the second light (L2) from escaping to the outside.

Figure 19C:
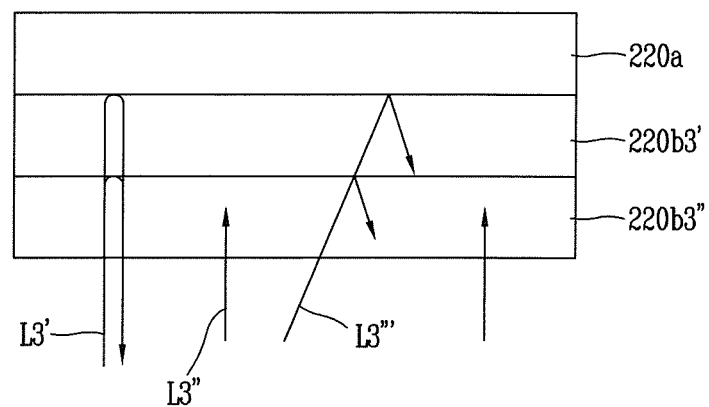

FIG. 19C illustrates an example in which the low reflection metal layer is, for example, formed with the conductive layer 220a and two light-blocking layers 220b3' and 220b3". With reference to FIG. 19C, a light-blocking layer 220b3'/220b3" may be formed with a first light-blocking layer 220b3' and a second light-blocking layer 220b3".

The first light-blocking layer 220b3' may include a metal oxide, and the second light-blocking layer 220b3" may include a material capable of absorbing light or coated with a light absorber. For example, the first light-blocking layer 220b3' may include at least one of ITO, IZO, and ITZO, and the second light-blocking layer 220b3" may include at least one of molybdenum (Mo), chromium (Cr), titanium (Ti), niobium (Nb), manganese (Mn), tantalum (Ta), and/or an alloy thereof. Embodiments are not limited to these materials.

$3a^{th}$ light (L3') and $3c^{th}$ light (L3'), which are external light, may be eliminated through destructive interference, and $3b^{th}$ light (L3") may be absorbed and eliminated by an absorbing metal of the second light-blocking layer 220b3". An organic light-emitting display device including the light-blocking layer 220b3'/220b3" with such a double-layer structure may have an effect of significantly reducing the reflectance of light introduced from the outside using a plurality of light-blocking layers.

Figure 19D:
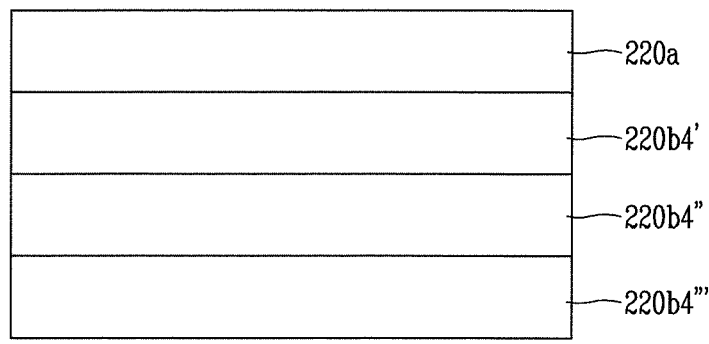

With reference to FIG. 19D, the low reflection metal layer may include a triple-layer structure 220b4'/220b4"/220b4'''. In other words, the light-blocking layer 220b4'/220b4"/220b4''' may include a first light-blocking layer 220b4', a second light-blocking layer 220b4", and a third light-blocking layer 220b4'''. The first light-blocking layer 220b4', the second light-blocking layer 220b4", and the third light-blocking layer 220b4''', respectively, may include a metal oxide or a light absorbing material or coated with a light absorber. Embodiments are not limited to these materials.

In addition, an organic light-emitting display device according to the present disclosure are not necessarily limited to the foregoing structure or materials. For example, an organic light-emitting display device may include a low reflection metal layer formed in various forms and orders. Furthermore, as described above, the present disclosure may be also applicable to a top-emission device as well as a bottom-emission device, and will be described below in detail through a third embodiment of the present disclosure.

Figure 20:
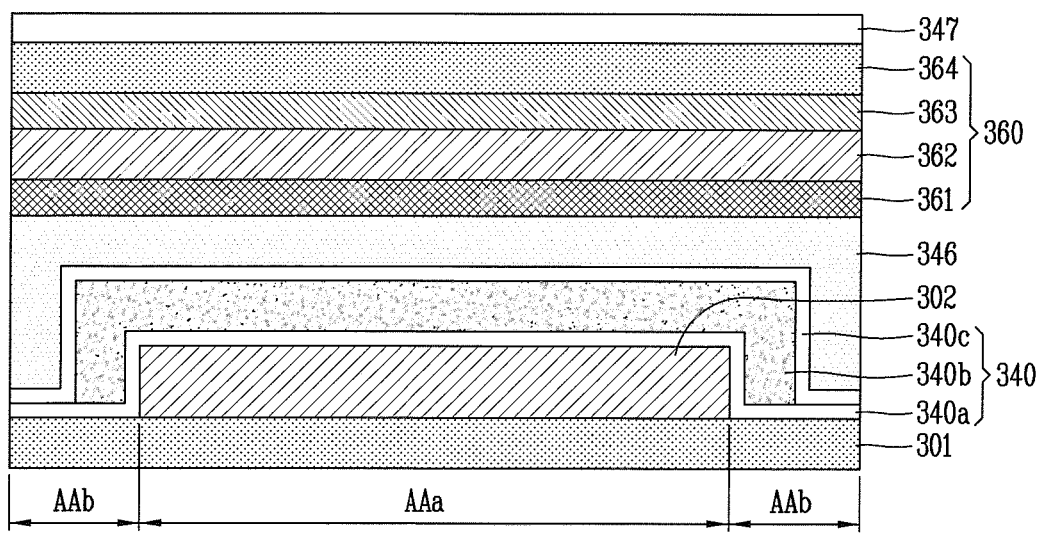
FIG. 20 is a cross-sectional view illustrating an organic light-emitting display device according to an embodiment of the present disclosure.
Figure 21:
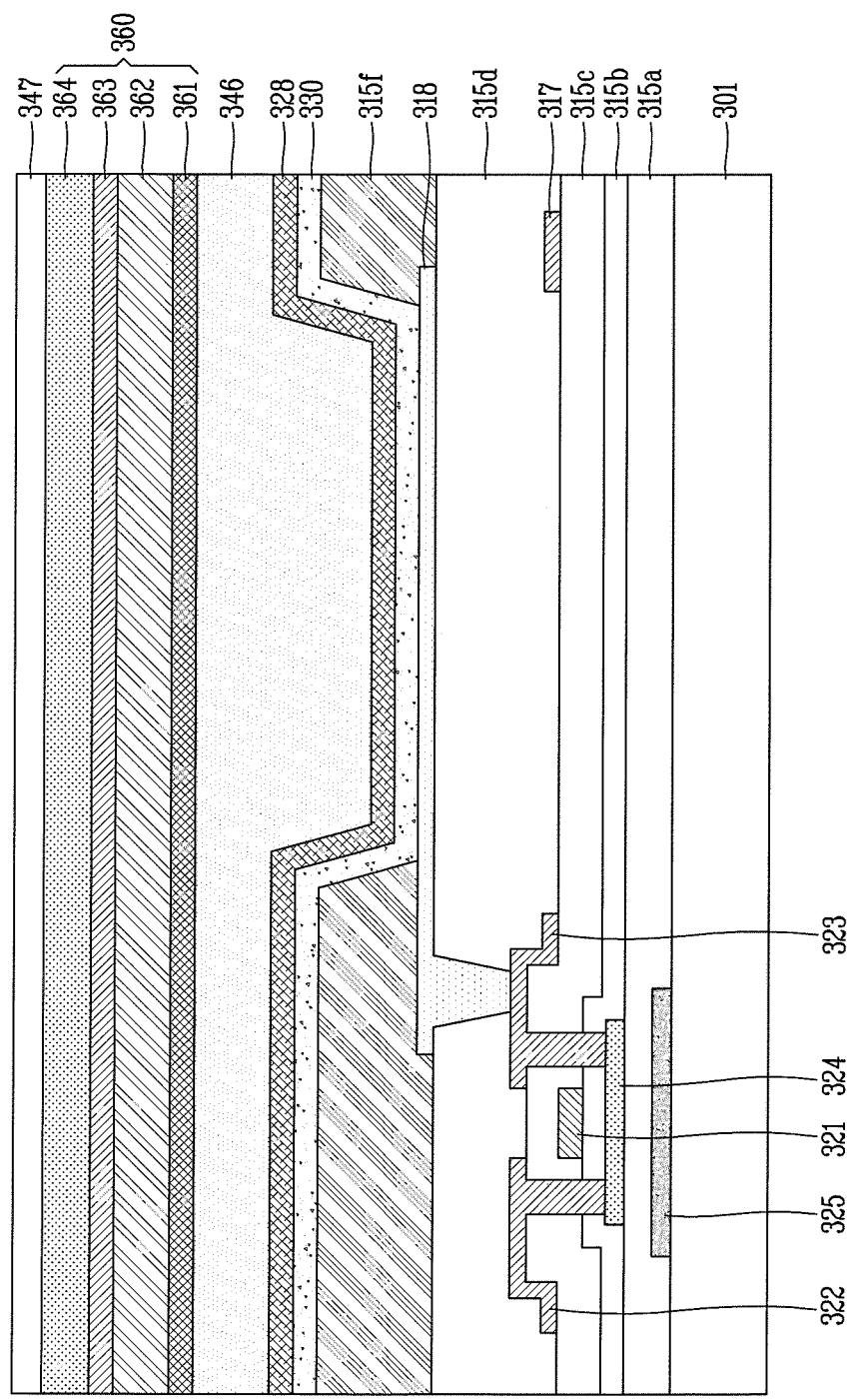
FIG. 21 is a cross-sectional view specifically illustrating a part of an organic light-emitting display device illustrated in FIG. 20.

FIG. 20 is a cross-sectional view illustrating an organic light-emitting display device according to an embodiment of the present disclosure. FIG. 21 is a cross-sectional view specifically illustrating a part of an organic light-emitting display device illustrated in FIG. 20.

In FIG. 21, a detailed cross-section of the panel unit is illustrated. In the panel unit, a plurality of subpixels may be arranged thereon in a matrix form, in which each subpixel may be selected from one of red subpixel (R), a green subpixel (G), a blue subpixel (B), and a white subpixel (W). FIG. 21 illustrates part of a panel unit for one subpixel of the WRGB subpixel as an example.

Similarly to the above-described embodiments of the present disclosure, an organic light-emitting display device according to an embodiment of the present disclosure may largely include a panel assembly for displaying an image and a flexible circuit board connected to the panel assembly. The panel assembly may include a panel unit divided into an active region and a pad region and a thin-film encapsulation layer provided on the panel unit while covering the active region.

With reference to FIGS. 20 and 21, a panel unit may be disposed on an upper surface of the substrate 301. The substrate 301 may be a flexible substrate. In a top-emission device in which an image is implemented in an opposite direction to the substrate 301, the substrate 301 may not be necessarily formed of a transparent material.

Furthermore, the active region may be disposed with a plurality of subpixels, and may be divided into a pixel section (AAa) disposed with a plurality of subpixels for displaying an image, and an outer peripheral section (AAb) formed at an outer periphery of the pixel section (AAa) for transmitting signal from the outside to the pixel section (AAa). The thin-film encapsulation layer 340 may be formed on the panel unit while covering part of the pixel section (AAa) and the outer peripheral section (AAb).

The subpixels may be disposed in a matrix form, and a driving element such as a scan driver, a data driver and the like for driving pixels and other components may be located in an outer region of the active region. Furthermore, a panel element 302 may be disposed on an upper surface of the substrate 301 in the pixel section (AAa). For convenience of explanation, the term "panel element 302" may commonly refer to an organic light-emitting diode and a TFT array for driving the organic light-emitting diode.

With reference to FIG. 21, each subpixel may include an organic light-emitting diode and an electronic device electrically connected to the organic light-emitting diode. The electronic device may include at least two TFTs, a storage capacitor, and the like. The electronic devices may be electrically connected to lines to receive and drive an electric signal from a driving device outside the panel unit. The arrangement of such electronic devices and lines electrically connected to the organic light-emitting diode is referred to as a "TFT array."

Here, only an organic light-emitting diode for one subpixel and a driving TFT for driving the organic light-emitting diode are illustrated in FIG. 21. However, this is merely for convenience of explanation, and embodiments of the present disclosure are not limited thereto. For example, embodiments may further include a plurality of TFTs, storage capacitors, and various lines. The TFT illustrated in FIG. 21 is a top-gate type TFT, and may include a light shielding layer 325, an active layer 324, a gate electrode 321, and source/drain electrodes 322 and 323 placed in order, but embodiments of the present disclosure are not limited to these types of TFTs.

The organic light-emitting diode may include a first electrode 318, an organic compound layer 330, and a second electrode 328. As described above, the first electrode 318 may be formed on the TFT array, and the organic compound layer 330 and the second electrode 328 may be sequentially disposed on the first electrode 318.

A TFT may include a switching transistor and a driving transistor. The switching transistor may be connected to a scan line and a data line 317, and may transmit a data voltage inputted to the data line 317 according to a switching voltage inputted to the scan line. A storage capacitor may be connected to the switching transistor and a power line, and may store a voltage corresponding to a difference between a voltage received from the switching transistor and a voltage supplied to the power line.

The driving transistor may be connected to the power line and storage capacitor to supply an output current in proportion to the square of a difference between a voltage stored in the storage capacitor and a threshold voltage to the organic light-emitting diode, and the organic light-emitting diode may emit light by the output current. The driving transistor may include an active layer 324, a gate electrode 321, and source/drain electrodes 322 and 323. The first electrode 318 of the organic light-emitting diode may be connected to the drain electrode 323 of the driving transistor. For an example, the driving transistor may include a light shielding layer 325 formed on the substrate 301 and a buffer layer 315a formed on the light shielding layer 325.

Furthermore, the driving transistor may include the active layer 324 formed on the buffer layer 315a and a first insulating layer 315b formed on the substrate 301 formed with the active layer 324. In addition, the driving transistor may include the gate electrode 321 formed on the first insulating layer 315b, a second insulating layer 315c formed on the substrate 301 formed with the gate electrode 321, and the source/drain electrodes 322 and 323 formed on the second insulating layer 315c and electrically connected to the source/drain region of the active layer 324 through a first contact hole.

A third insulating layer 315d may be formed on the substrate 301 formed with the driving transistor. In one example, the drain electrode 323 of the driving transistor may be electrically connected to the first electrode 318 through a second contact hole formed on the third insulating layer 315d and fourth insulating layer 315e. The first electrode 318 may be formed of a transparent conductive material such as ITO or IZO or a reflective conductive material such as aluminum, silver, and/or an alloy thereof. Embodiment are not limited to these materials.

In addition, a bank 315f may be formed at a boundary between each subpixel region at an upper portion of the third insulating layer 315e. In other words, the bank 315f may have a lattice structure in a matrix form as a whole, may surround an edge of the first electrode 318, and may expose part of the first electrode 318.

The organic compound layer 330 of the foregoing organic light-emitting diode may be formed on the entire surface of the substrate 301. In this case, a patterning process may be omitted to simplify the production process. However, embodiments of the present disclosure are not necessarily limited thereto, the organic compound layer 330 may be formed on the first electrode 318 between the banks 315f.

The second electrode 328 may be formed on the organic compound layer 330 of the display area. The second electrode 328 may receive a common voltage, and may be formed of a reflective conductive material including calcium (Ca), barium (Ba), magnesium (Mg), aluminum (Al), silver (Ag), or the like, or a transparent conductive material such as ITO, IZO, or the like. Embodiment are not limited to these materials.

A capping layer formed of an organic material, such as a polymer or the like, over the entire surface of the substrate 301 of the pixel section may be formed at an upper portion of the substrate 301 formed with the second electrode 328. However, embodiments of the present disclosure are not necessarily limited thereto, and the capping layer may not be formed thereon.

The capping layer may have a specific refractive index to perform the role of collecting light to enhance the emission of light in a top-emission device. The capping layer may perform the role of one optical adjustment layer. The capping layer may adjust a refractive index difference from the outside to increase the reflectance on a boundary surface between the capping layer and the outside. Through an increase of the reflectance, the capping layer may exhibit a micro-cavity effect at a specific wavelength. In one example, the capping layer may be formed with a different thickness for each subpixel, although embodiments are not limited thereto.

In addition, the thin-film encapsulation layer 340 may be formed on an upper surface of the substrate 301 to cover the panel element 302. In the thin-film encapsulation layer 340, for example, a first passivation layer 340a, an organic layer 340b, and a second passivation layer 340c may be sequentially formed as an encapsulation means on the substrate 301 provided with the panel element 302 to constitute the thin-film encapsulation layer 340. However, as described above, the number of inorganic layers and organic layers constituting the thin-film encapsulation layer 340 is not limited to this structure.

A integrated circuit (IC) chip may be mounted in a pad region of the panel assembly having the foregoing configuration in COG manner. Electronic elements for processing a driving signal may be mounted on a flexible circuit board in a chip-on-film (COF) manner, and a connector for transmitting an external signal to the flexible circuit board may be provided thereon.

The flexible circuit board may be folded in a backward direction of the panel assembly to face a lower surface of the panel assembly. Here, an isotropic conductive film may be used to electrically connect a terminal portion of the panel unit to a connection portion of the flexible circuit board.

In an organic light-emitting display device according to an embodiment of the present disclosure having the foregoing configuration, an optical member 360 according to an embodiment of the present disclosure may be provided on the thin-film encapsulation layer 340 to prevent the reflection of light incident from the outside. An adhesive layer 346 having transparent and adhesive characteristics may be interposed between the substrate 301 and the optical member 360. The optical member 360 may suppress the reflection of external light to perform the role of enhancing the visibility of an organic light-emitting display device, as well as minimizing the loss of light emitted from the organic light-emitting diode to the outside.

The optical member 360 according to an of the present disclosure may include a first retardation layer 361, a second retardation layer 362, and a linear polarizer 363 sequentially provided on the thin-film encapsulation layer 340. A passivation layer 364 may be provided on the linear polarizer 363. Furthermore, a surface treatment layer 347 including an antireflection film may be located on the passivation layer 364.

The first retardation layer 361 may be a blue CLC layer. The second retardation layer 362 may a QWP for generating a phase retardation of λ/4. The linear polarizer 363 may have a polarization axis to linearly polarize light in the direction of the polarization axis.

The CLC layer 361 and the second retardation layer 362 may be located on the same side of the linear polarizer 363. For example, the CLC layer 361 and the second retardation layer 362 may be located between the linear polarizer 363 and the substrate 301.

The second retardation layer 362 may have an optical axis twisted by about 45° (degrees) from the polarization axis of the linear polarizer 363. The second retardation layer 362 and the linear polarizer 363 may form a circular polarizer. In other words, the optical axis of the second retardation layer 362 and the transmission axis of the linear polarizer 363 may be disposed to have an angle of 45° (degrees). Reflection may occur within the second retardation layer 362 due to external light, and the reflected light is orthogonal to the transmission axis of the linear polarizer 363 when exiting from the organic light-emitting diode, thereby reducing reflectance.

The first retardation layer 361 (e.g., CLC layer) may be provided at a lower portion of the second retardation layer 362 (e.g., QWP) for recycling the reflected light to enhance luminance. For example, light reflected from the CLC layer may be recycled to pass through the second retardation layer 362 and the linear polarizer 363, thereby further increasing transmittance.

The first retardation layer 361 may be a blue CLC. Thus, the enhancement of the blue device (light-emitting diode) may contribute to efficiency enhancement in driving full-color (WRGB), wherein the reflectance increases, but increases only at blue wavelengths. However, in case of blue, the visibility and luminance are low; thus, there is no large difference in the reflection visual perception.

It will be apparent to those skilled in the art that various modifications and variations may be made in the present disclosure without departing from the spirit or scope of the invention. Thus, it is intended that embodiments of the present disclosure cover the modifications and variations of this invention provided they come within the scope of the appended claims and their equivalents.

What is claimed is:

1. An organic light-emitting display device, comprising:
a substrate;
a plurality of pixels on one surface of the substrate;
an optical member on another surface of the substrate opposite to the surface on which the plurality of pixels are disposed, the optical member comprising:
   a blue cholesteric liquid crystal (CLC) layer overlapping with the plurality of pixels and configured to transmit light having only one of a left-handed circularly polarized light component and a right-handed circularly polarized light component, the blue CLC layer having a reflection peak at a wavelength between 430 nm and 470 nm;
   a quarter wave plate on the blue CLC layer configured to convert the transmitted light, having the left-handed circularly polarized light component or right-handed circularly polarized light component, into linear polarized light;
   a linear polarizer on the quarter wave plate and having a transmittance of 43-45%, the linear polarizer being between the another surface of the substrate and a viewing surface of the organic light-emitting display device; and
   a passivation layer on the linear polarizer; and
a surface treatment layer including an antireflection (AR) film on the passivation layer,
wherein the quarter wave plate is between the blue CLC layer and the linear polarizer, and
wherein an overall reflectance of the organic light-emitting display device is less than 1%.

2. The organic light-emitting display device of claim 1, wherein the quarter wave plate has an optical axis twisted by 45° from a polarization axis of the linear polarizer.

3. An organic light-emitting display device, comprising:
a substrate having no polarization component;
a plurality of pixels arranged in a matrix form on the substrate and including a plurality of organic light-emitting diodes and thin film transistors (TFTs);
an optical member for luminance enhancement and reducing reflection, the optical member comprising:
   a linear polarizer overlapping with the plurality of pixels and having a transmittance between 43% and 45%;
   a blue cholesteric liquid crystal (CLC) layer configured to transmit light, the light having only one of: a left-handed circularly polarized light component and a right-handed circularly polarized light component;
   a quarter wave plate configured to convert the transmitted light, having the left-handed circularly polarized light component or right-handed circularly polarized light component, into linear polarized light, the quarter wave plate being between the blue CLC layer and the linear polarizer; and a passivation layer on the linear polarizer; and a surface treatment layer including an antireflection (AR) film on the passivation layer, wherein the optical member is on an upper surface or a lower surface of the substrate opposite to a surface on which the plurality of pixels are disposed;

wherein the linear polarizer is between the substrate and a viewing surface of the organic light-emitting display device, wherein each of the plurality of pixels includes a red subpixel, a green subpixel, a blue subpixel, and a white subpixel, wherein a color temperature of the white subpixel is increased to a higher color temperature by the blue CLC layer, wherein the blue CLC layer is disposed to correspond to the red subpixel, the green subpixel, the blue subpixel, and the white subpixel, and wherein an overall reflectance of the organic light-emitting display device is less than 1%.

4. The organic light-emitting display device of claim 3, wherein the blue CLC layer and the quarter wave plate are located between the substrate and the linear polarizer.

5. The organic light-emitting display device of claim 3, wherein a reflection peak of the blue CLC layer corresponds to a blue emission peak of the organic light-emitting diode and is at a wavelength between 430 nm and 470 nm.

6. The organic light-emitting display device of claim 3, wherein at least one of conductive lines and electrodes of the TFTs in the plurality of pixels has a multi-layer structure including a conductive layer and a light blocking layer, the light blocking layer being formed of a material to absorb external light introduced through the substrate.

7. The organic light-emitting display device of claim 6, wherein the light blocking layer is located at a portion of the at least one of the conductive lines and the TFTs in which external light is incident.

8. The organic light-emitting display device of claim 6, wherein the light blocking layer comprises:

a first blocking layer comprising a metal oxide; and a second blocking layer comprising a metal capable of absorbing light.

9. The organic light-emitting display device of claim 3, further comprising an adhesive layer connected between the substrate and the blue CLC layer.

10. The organic light-emitting display device of claim 9, wherein the adhesive layer comprises a curable adhesive material.

11. The organic light-emitting display device of claim 3, further comprising a black bank at a boundary of at least one of the red subpixel, the green subpixel, the blue subpixel, and the white subpixel, the black bank comprising a black-based material.

12. An organic light-emitting display device, comprising:

a display panel including:

a substrate having no polarization component; and a plurality of subpixel regions on the substrate, the plurality of subpixel regions being defined by a plurality of gate lines and data lines, each subpixel including:

an organic light-emitting diode; and a thin film transistor (TFT) including a plurality of light-blocking layers;

an optical member on an upper surface or a lower surface of the display panel, the optical member including a stacked structure of:

a blue cholesteric liquid crystal (CLC) layer having a reflection peak at a wavelength between 430 nm and 470 nm, the blue CLC layer being adhered to a surface of the substrate by an adhesive layer opposite to a surface of the substrate on which the plurality of subpixel regions are disposed;

a quarter wave plate;

a linear polarizer having a transmittance between 43% and 45%; and a passivation layer on the linear polarizer; and a surface treatment layer including an antireflection (AR) film directly on the passivation layer, wherein an overall reflectance of the organic light-emitting display device is less than 1%, wherein the quarter wave plate is between the blue CLC layer and the linear polarizer, and wherein the linear polarizer is between the substrate and a viewing surface of the organic light-emitting display device, and wherein the plurality of subpixel regions includes a red subpixel, a green subpixel, a blue subpixel, and a white subpixel, and wherein the blue CLC layer is disposed to correspond to the red subpixel, the green subpixel, the blue subpixel, and the white subpixel.

13. The organic light-emitting display device of claim 12, wherein the optical member:

suppresses reflection of an external light to enhance the visibility of the organic light-emitting display device; and minimizes a loss of light emitted from the organic light-emitting diode to outside.

14. The organic light-emitting display device of claim 12, wherein the reflection peak of the blue CLC layer corresponds to a blue emission peak of the organic light-emitting diode.

15. The organic light-emitting display device of claim 12, wherein the plurality of light blocking layers includes a material coated with a light absorber for absorbing light from outside.

16. The organic light-emitting display device of claim 1, wherein:

at least one of the plurality of pixels includes a red subpixel, a green subpixel, a blue subpixel, and a white subpixel, the blue CLC layer is disposed to correspond to the red subpixel, the green subpixel, the blue subpixel, and the white subpixel, and a current efficiency of the organic light-emitting display device at the at least one of the plurality of pixels at a full white operation is higher than 26.7 cd/A.

17. The organic light-emitting display device of claim 3, wherein a current efficiency of the organic light-emitting display device at the plurality of pixels at a full white operation is higher than 26.7 cd/A.

18. The organic light-emitting display device of claim 12, wherein a current efficiency of the organic light-emitting display device at the plurality of subpixel regions at a full white operation is higher than 26.7 cd/A.

* * * * *